(12) United States Patent
Keady

(10) Patent No.: US 8,312,704 B2
(45) Date of Patent: Nov. 20, 2012

(54) HIGH PRESSURE FIELD EMITTER, PHOTOIONIZATION, PLASMA INITIATION AND FIELD DEVICES

(76) Inventor: John Patrick Keady, San Jose, CA (US)

(*) Notice: Subject to any disclaimer, the term of this patent is extended or adjusted under 35 U.S.C. 154(b) by 1953 days.

(21) Appl. No.: 11/383,847

(22) Filed: May 17, 2006

(65) Prior Publication Data

US 2006/0227830 A1  Oct. 12, 2006

Related U.S. Application Data

(63) Continuation-in-part of application No. 10/441,638, filed on May 20, 2003, now Pat. No. 7,096,660.

(51) Int. Cl.
*F03H 1/00* (2006.01)
(52) U.S. Cl. .................................. 60/203.1; 60/202
(58) Field of Classification Search .................. 60/202, 60/203.1; 315/111.41, 111.61
See application file for complete search history.

(56) References Cited

U.S. PATENT DOCUMENTS 3,155,858 A * 11/1964 Lary et al. ...................... 60/202
6,449,941 B1 * 9/2002 Warboys et al. ................ 60/202
6,834,492 B2 * 12/2004 Hruby et al. .................... 60/202

* cited by examiner

*Primary Examiner* — Ehud Gartenberg
*Assistant Examiner* — Lorne Meade

(57) ABSTRACT

At least one exemplary embodiment is directed to a propulsion device that ionizes a portion of a medium and ExB drifts the ionized portion providing thrust where the ionized portion is created using high pressure field emitters comprising: a substrate layer; a gate layer; a field emitter tip; and a cover layer, wherein the field emitter tip is configured to emit electrons in a region when there is a potential difference between the gate layer and the field emitter tip, where the cover layer separates an ambient environment at a pressure from the region, and where a substantial portion of the electrons pass through the cover layer.

11 Claims, 13 Drawing Sheets

Fig. 2A: Simulated 1 KeV Electron Penetration through a 10 nm barrier substrate
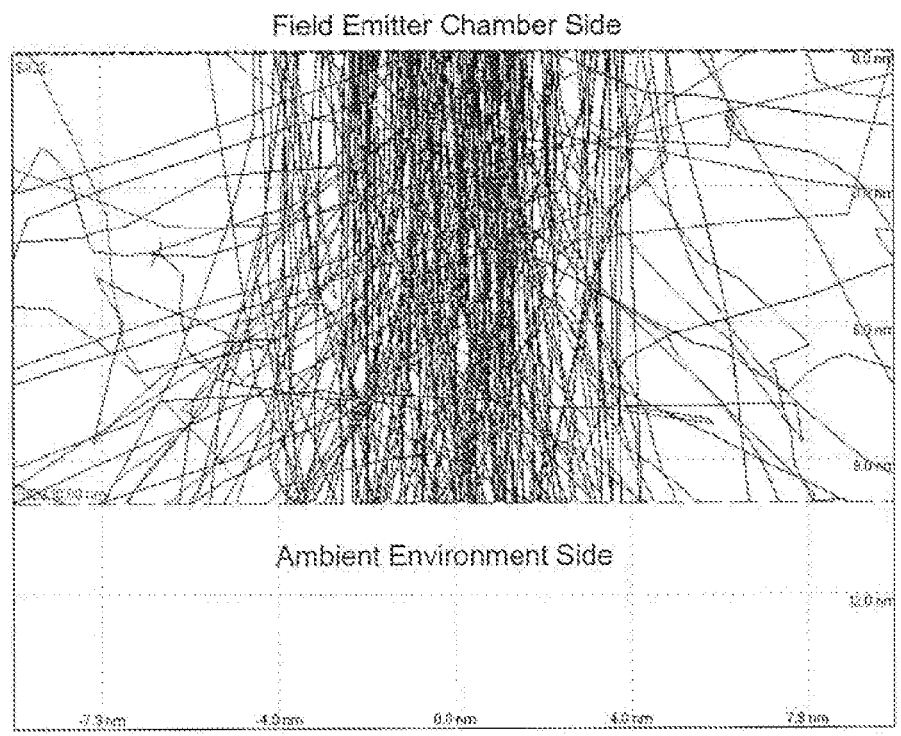
Fig. 2B Simulated Transmitted 1KeV Electron Energy through the 10nm barrier substrate
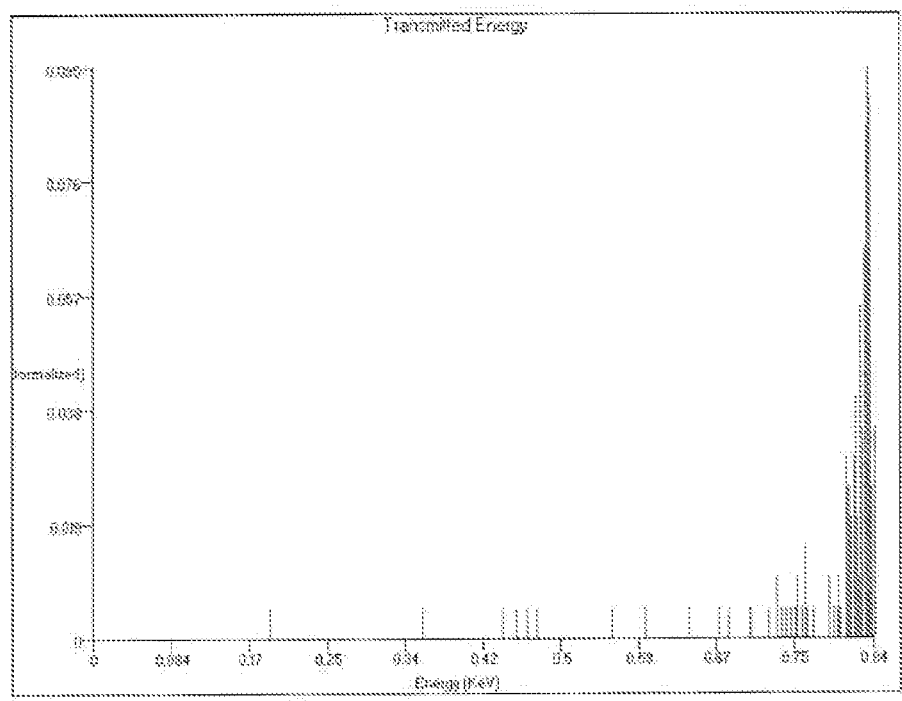

Fig. 2C: Simulated 5 KeV Electron Penetration through a 100 nm barrier substrate
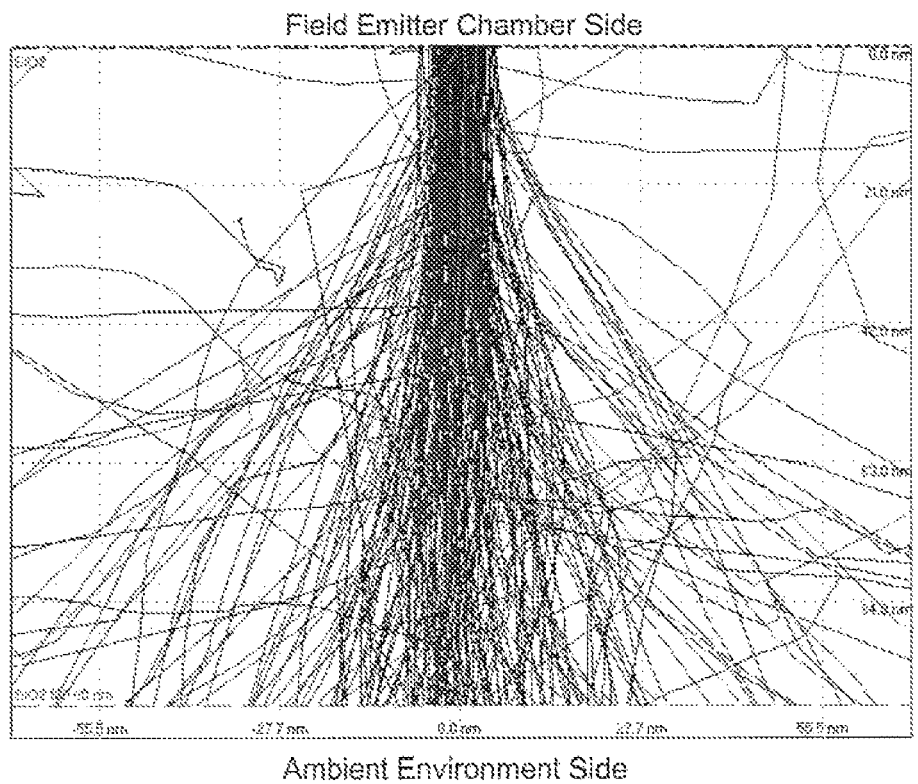
Fig. 2D: Simulated Transmitted 5KeV Electron Energy through the 100nm barrier substrate
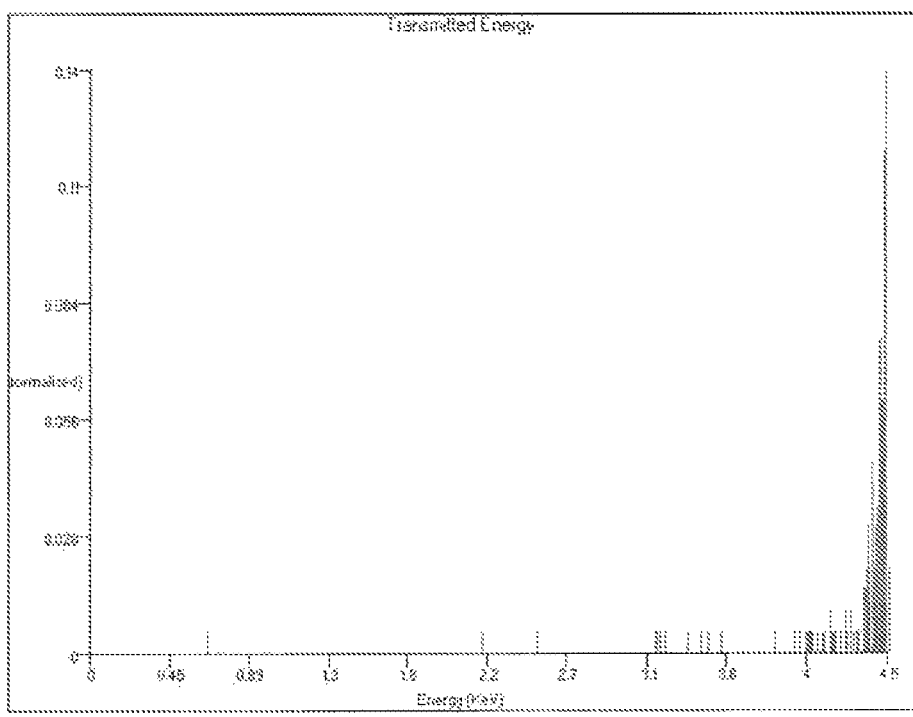

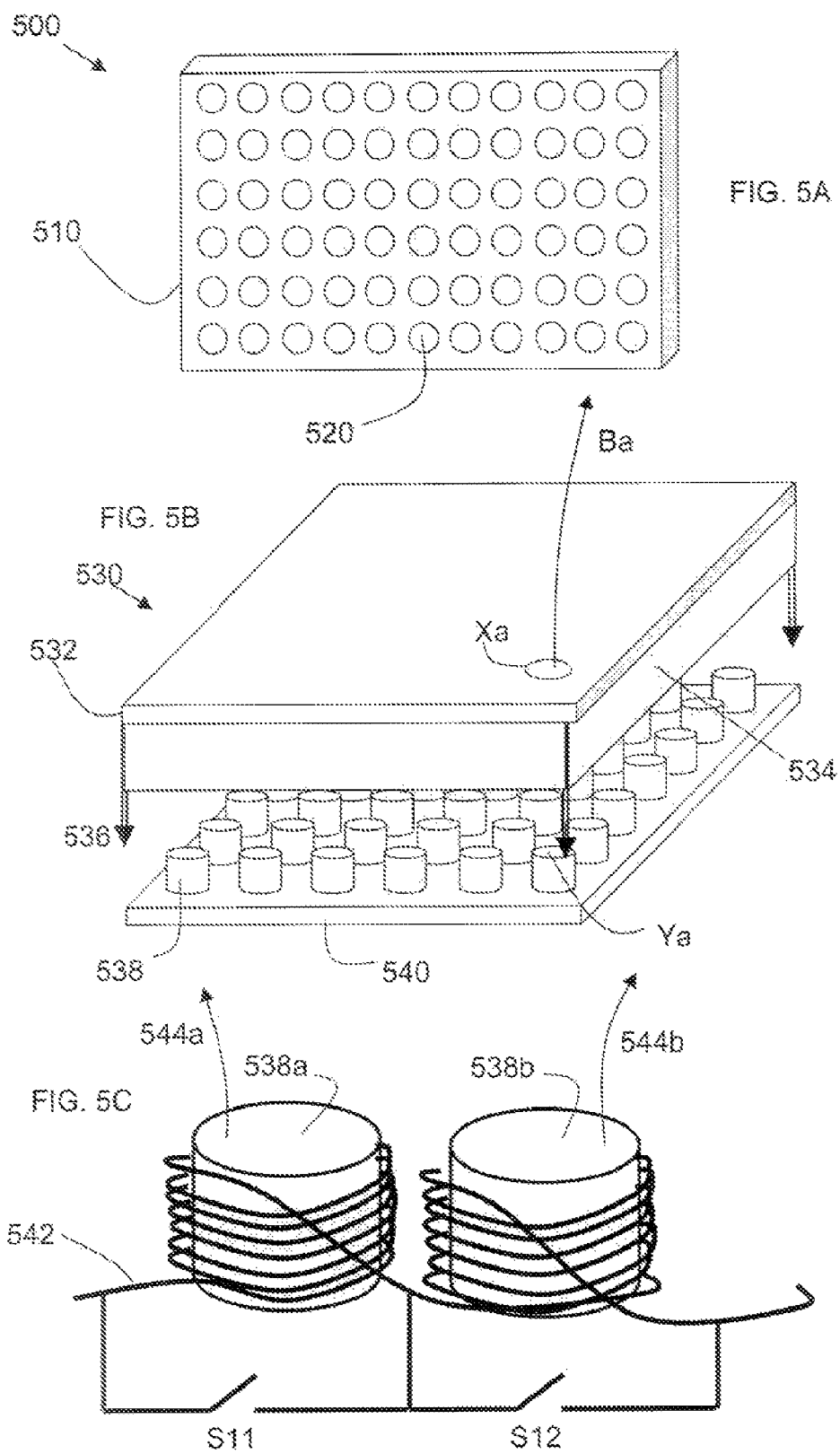

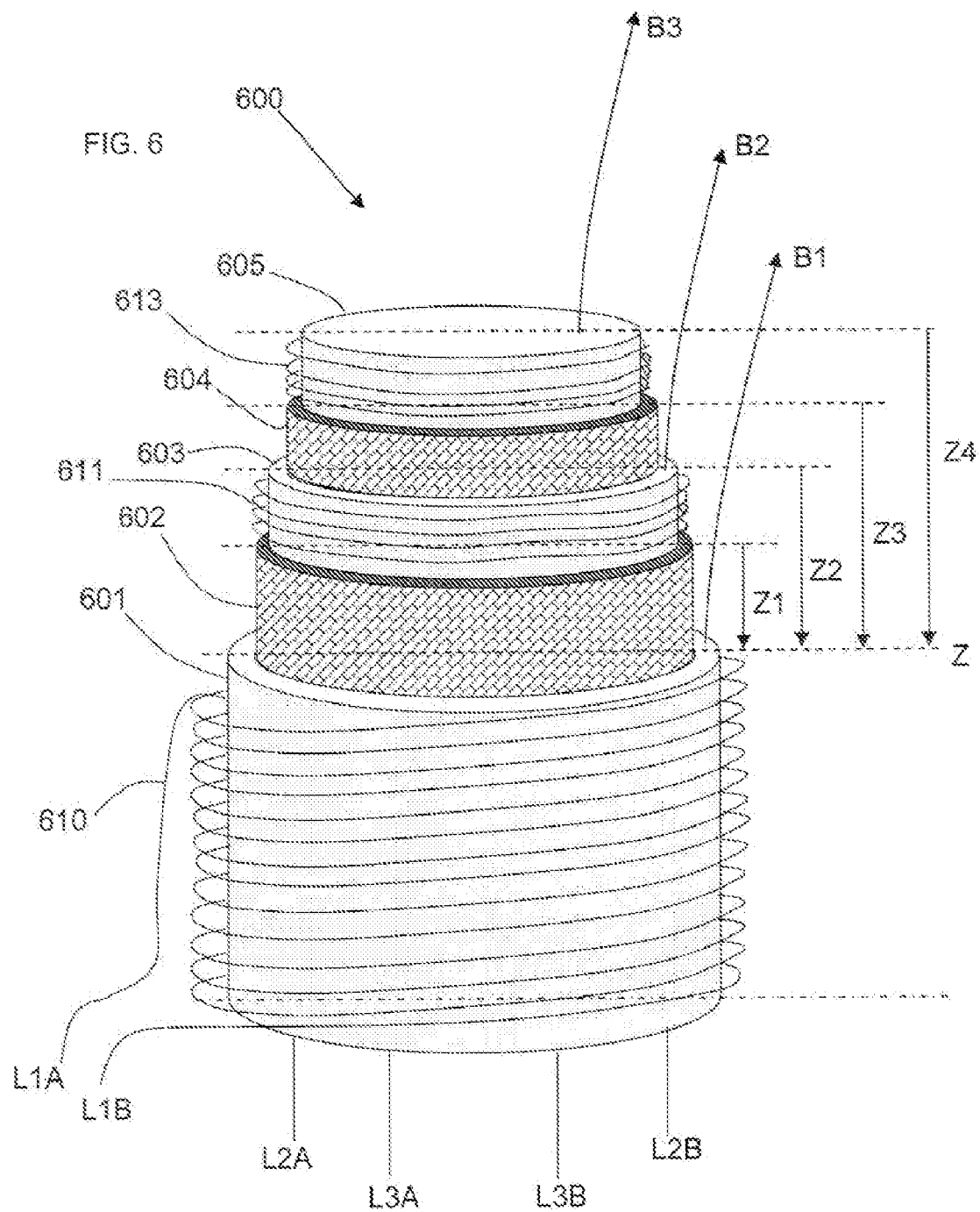

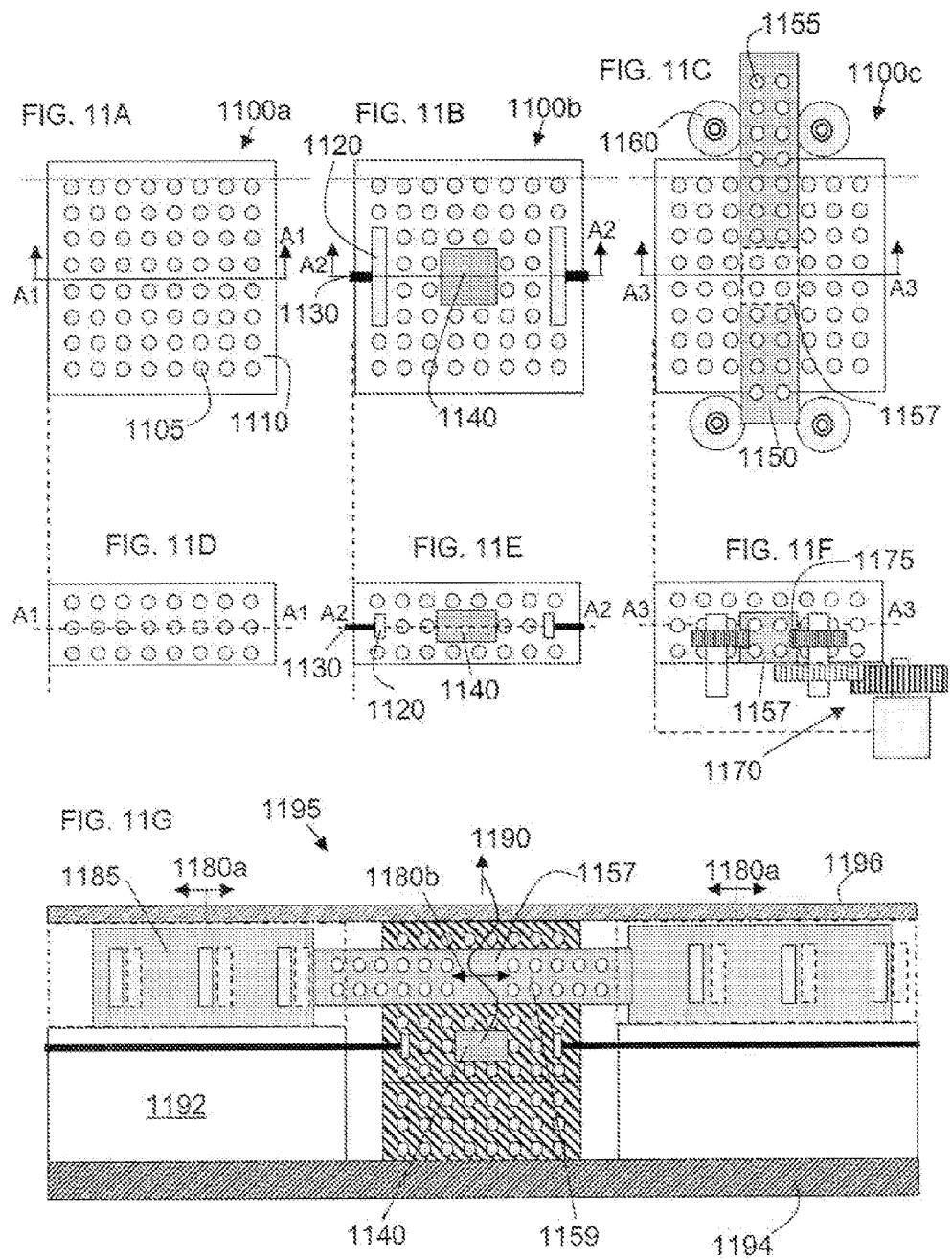

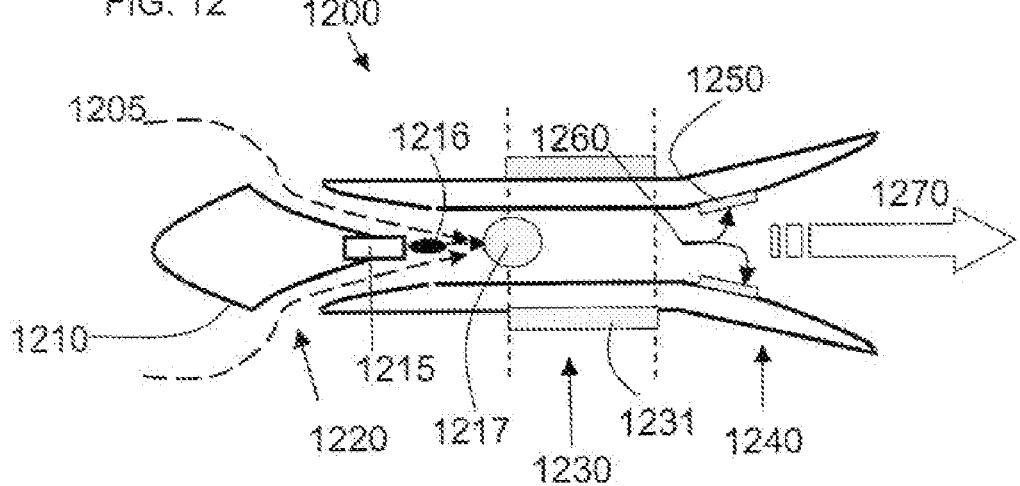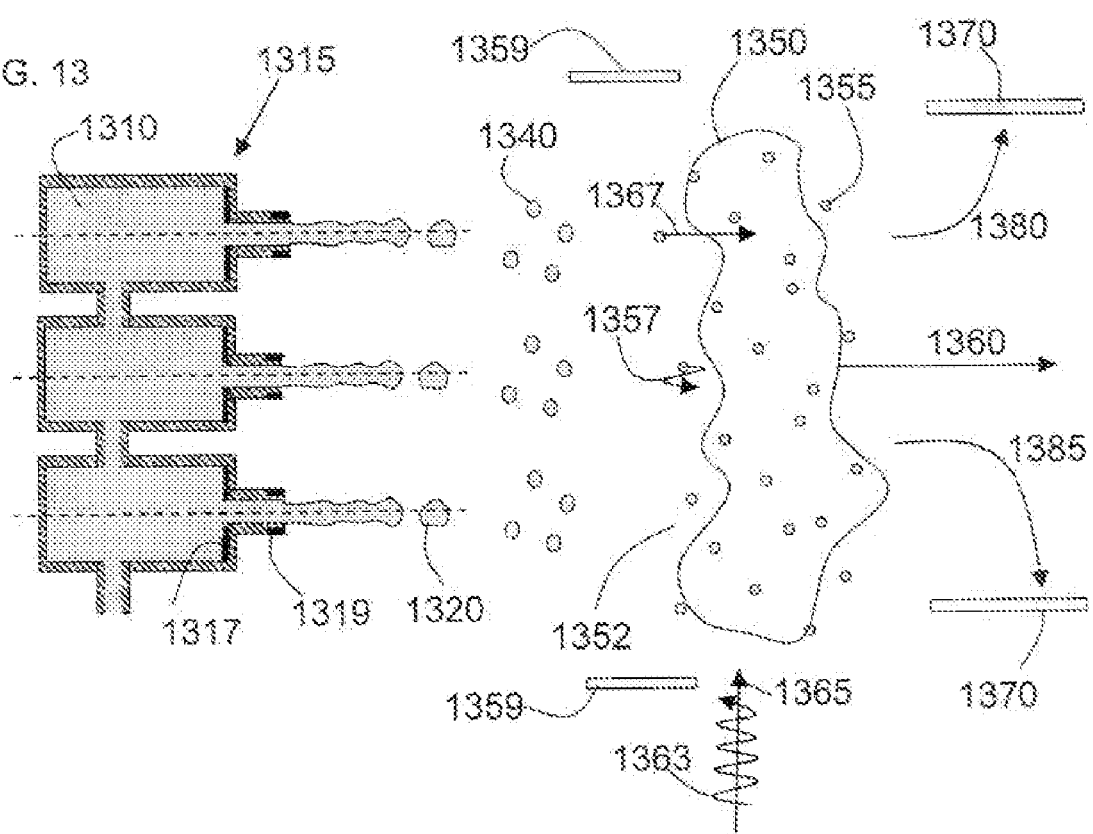

HIGH PRESSURE FIELD EMITTER, PHOTOIONIZATION, PLASMA INITIATION AND FIELD DEVICES

CROSS-REFERENCE TO RELATED APPLICATIONS

This application claims the priority benefit of and is a continuation in part, under 35 U.S.C. §120, of U.S. patent application Ser. No. 10/441,638 filed on 20 May 2003 now U.S. Pat. No. 7,096,660, incorporated herein by reference in its entirety.

FIELD OF THE INVENTION

The invention relates in general to devices and methods of using an ambient environment as a propulsion fluid, more particularly although not exclusively, the invention relates to a high pressure field emitter and field device used to generate plasma and provide propulsion in an ambient environment, photoionization, and plasma initiation methods.

BACKGROUND OF THE INVENTION

Patent application (US 2004/0070340, U.S. application Ser. No. 10/44,638) discusses the background and foundation for the use of an ambient environment as the propulsive medium, where ambient environment refers to the medium in an ionization region, which may or may not surround a vehicle.

Conventional motorized atmospheric vehicles utilize engines that have moving parts to compress, combust and expel ambient atmosphere to provide propulsive thrust to the attached vehicle. The moving parts have lifetimes associated with the imposed stress, both pressure and thermal, and are limited in the energies imparted to the combusted air.

FIG. 1A illustrates the placement of a conventional atmospheric propulsion system 100 on an airfoil 110 of a vehicle 120, and FIG. 1B illustrates the internal components of the conventional propulsion system 100, the compressor 130, fuel injectors 140, the combustion chamber 150, the expander section 160 and the exhaust nozzle 170.

Strong thin films of micron and submicron size, able to withstand pressure differences between a vacuum on one side of the film and atmospheric pressure on the opposite side, while still allowing an energetic electrons to pass through has been discussed in Neukermans (U.S. Pat. No. 4,486,282), incorporated by reference herein it entirety, for use in cathode ray tubes. The thin films can be made of SiC, BN, $B_4C$, $Si_3N_4$, $Al_4C_3$, and other similar strength materials as known by one of ordinary skill in the relevant arts that have similar electron penetration characteristics, low stress, and pinhole free.

In addition to electron ionization of neutrals into plasma. photoionization can be used to generate plasmas at relatively high pressures. Lasers have been used to preionize organic gas Tetrakis (dimethylamine) ethylene to initiate a plasma at 80 Torr, then use roughly 2.8 kW of RF power to form a stable plasma density ("Radiofrequency Initiation and Radiofrequency Sustainment of Laser Intiate Seeded High Pressure Plasma", Eric S. Paller, et Al., *Radio Power in Plasma: 14th Topical Conf.*, Edited by T. K. Mau and J. deGrassie, 2001 American Institute of Physics 0-7354-0038-5, herein referred to as the Paller reference).

Another method of photo ionization is to tailor the laser to the ionization energy of the medium in the plasma generation chamber. One method of generating a powerful yet low power consumption laser is to utilize pumped cavity photonic crystals (see U.S. Pat. No. 6,711,200, filed 23 Mar. 2004). A background in photonic crystals is discussed in "Photonic Crystals: The Road from Theory to Practice", Steven G. Johnson et al., ISBN 0-7923-7609-9, 2002, and "Photonic Crystals: Molding the Flow of Light", John D. Joannopoulos et al., ISBN 0-691-03744-2, 1995, both of which are incorporated by reference in their entirety. Several methods of photonic crystal fabrication are known for example U.S. patent application Ser. No. 11/265,041 discusses the formation of three dimensional photonic crystals using aphrons.

SUMMARY OF THE INVENTION

At least one exemplary embodiment is directed to an engine, using high pressure field emitters as an ionizing electron source to produce a plasma, which is ExB drifted to produce propulsion.

At least one exemplary embodiment is directed to an engine, using electromagnetic heating to produce a plasma, which is ExB drifted to produce propulsion.

At least one exemplary embodiment is directed to a vehicle surface, using high pressure field emitters as an ionizing electron source to produce a plasma, which is ExB drifted to produce propulsion.

At least one exemplary embodiment is directed to a vehicle surface, using electromagnetic heating to produce a plasma, which is ExB drifted to produce propulsion.

At least one exemplary embodiment is directed to a field emitter that can operate at atmospheric pressures.

At least one exemplary embodiment is directed to a charged fluid seeding system providing the initial ionization charged particles for plasma initialization and sustainment.

At least one exemplary embodiment is directed to an electric and magnetic field device that can provide ExB field to accelerate a plasma.

Further areas of applicability of embodiments of the present invention will become apparent from the detailed description provided hereinafter. It should be understood that the detailed description and specific examples, while indicating exemplary embodiments of the invention, are intended for purposes of illustration only and are not intended to limited the scope of the invention.

BRIEF DESCRIPTION OF THE DRAWINGS

Exemplary embodiments of the present invention bill become apparent from the following detailed description, taken in conjunction with the drawings in which:

FIGS. 2A-2D illustrate simulations of electron trajectories through a thin film barrier and subsequent energy transmittance;

FIG. 5A illustrates a flat panel field emitter array in accordance with at least one exemplary embodiment configured to create a plasma in an ambient environment;

FIG. 5B illustrates a magnetic field device configuration for generating magnetic fields for drifting a generated plasma in accordance with at least one exemplary embodiment;

FIG. 5C illustrates two core coils in the magnetic field device illustrated in FIG. 5B;

FIG. 6 illustrates at least one exemplary embodiment of a variation of a the core coil in accordance with at least one exemplary embodiment;

FIGS. 11A-11F illustrate various layers of a photonic laser, and FIG. 11G illustrates a photonic laser in accordance with at least one exemplary embodiment, where the emission is controlled by a shifting photonic crystal section moved by at least one vertical comb drive.

FIG. 12 illustrates an engine configuration in accordance with at least one exemplary embodiment using a charged fluid system to initiate a plasma in the engine; and FIG. 13 illustrates a charged fluid injection system for initiating a plasma in a propulsion system in accordance with at least one exemplary embodiment.

DETAILED DESCRIPTION OF EXEMPLARY EMBODIMENTS OF THE PRESENT INVENTION

The following description of exemplary embodiment(s) is merely illustrative in nature and is in no way intended to limit the invention, its application, or uses.

Processes, methods, materials and devices known by one of ordinary skill in the relevant arts may not be discussed in detail but are intended to be part of the enabling discussion where appropriate (e.g., the processes and materials in "Principles of Plasma Discharges and Materials Processing", Michael A. Lieberman, et al., ISBN 0-471-00577-0, 1994). For example although air is used as an example of an ambient environment used in the illustrative examples the ambient environment can be include any gas or fluid that can be charged, (e.g. by either electron addition/removal or ion addition/removal/creation), and accelerated in a ExB drift mode (for example charged micro droplets of water, Nitrogen Gas, CO2, and any other material that can be charged and ExB drifted as known by one of ordinary skill in the relevant art and equivalents). Additionally, examples of electric and magnetic field generation device(s) are discussed, however exemplary embodiments are not limited to any particular device for generating electric and magnetic fields.

Note that in non-limiting examples an engine with a plasma generation chamber is discussed. However at least one exemplary embodiment can be used to form the skin of a vehicle, the skin now being used to propel the vehicle.

Exemplary Embodiment Summaries

Exemplary embodiments are provided for illustrative non-limiting purposes only.

The first exemplary embodiment is directed to an engine or a vehicle surface, using high pressure field emitters as an ionizing electron source to produce a plasma, which is ExB drifted to produce propulsion. In the example, a planar configuration of ionizing plates including micro high pressure field emitter electron sources is illustrated in combination with an an electric/magnetic field device.

The second exemplary embodiment is directed to an engine or a vehicle surface, using an electromagnetic ionizing source to produce a plasma, which is ExB drifted to propulsion. In the non-limiting example provided, a planar configuration of ionizing plates including ionizing photon emitters is illustrated in combination with an electric/magnetic field device.

In a third exemplary embodiment, a charged fluid is injected into a chamber; the charged fluid droplets evaporating naturally or aided by laser heating; the resultant free electron are oscillated by an electromagnetic field producing plasma in the chamber, and an ExB field is created to drive the plasma in a direction.

I. First Exemplary Embodiment
I.A. High Pressure Field Emitter

Figure 3A:
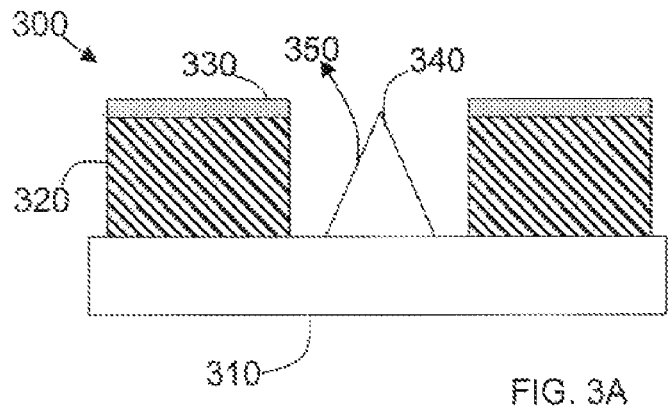
FIG. 3A illustrates a conventional field emitter.

FIG. 3A illustrates a "Spindt-type" conventional field emitter which operates a low pressure to avoid arcing and performance degradation. It includes a field emitter tip 340 formed on a semiconductor substrate 310. Refractory metal, carbide, diamond, and silicon tips, silicon carbon nanotubes, and metallic nanowires are examples of some of the materials that the field emitter tip can be made of including any other materials as known by one of ordinary skill in the relevant art and equivalents. The field emitter tip 340 is adjacent to a first insulating layer 320 and a conducting gate layer 330. By applying an appropriate voltage to the conducting gate layer 330, the current to the field emitter tip 340 is controlled.

Field emitters typically operate in very high vacuums (often better than $10^{-8}$ Torr for Spindt types and nanowires, and $10^{-7}$ Torr for nanotubes. This is because the gate voltages required to generate field emitted currents are also sufficient to produce arc discharge between the gate layer 330 and emitter tip 340 at higher pressure levels consistent with other low vacuum electronic products. The vacuum requirements limit the number of field emitter (FE) applications to those employing expensive high vacuum systems. The FEs must also the handled with care because a single dust particle can short out a FE. Thus conventional FEs are prone to arcing at elevated pressure (>about $10^{-7}$ Torr) and shorting due to contaminants (e.g., oil or dust, particle).

The substrate layer 310 can be formatted of an suitable material such as a semiconductor material, silicon, germanium, III-V semiconductor materials (e.g., GaAs), insulating materials (e.g., glass, plastic), with a semi conductive layer forms on the insulating material, other materials as known by one of ordinary skill in the relevant arts and equivalents. The substrate layer 310 can also be doped so that a potential difference between the gate layer 330 and the field emitter tip 340 will allow current to flow to the emitter tip 340.

The first insulating layer 320 can be made of various insulating materials (e.g., silicon dioxide, silicon nitride, Si, other insulating materials as known by one of ordinary skill in the relevant arts and equivalents). The first insulating layer can have various thicknesses (e.g., 0.25 micrometer to 10 micrometer) and should be large enough to support the gate layer voltage.

The gate layer 330 can be any type of conductive material (e.g., a refractory metal, molybdenum, niobium chromium, hafnium, combinations of metals and their carbides, other conductive materials as known by one of ordinary skill in the relevant art and equivalents). The conducting gate layer can vary in thickness (e.g., 0.01 micrometer to 10 micrometer), and should be thick enough to allow conduction of a gate current.

The field emitter tip 340 can be formed from a refractory metal (e.g., molybdenum, niobium, hafnium, and a combination of such materials), a nanotube, a nanowire (e.g., ZnO, a refractory metal, a refractory metal carbides, or diamond), or other types of emitter tips as known by one of ordinary skill in the relevant art and equivalents. A tip an be formed by various processes, for example U.S. Pat. No. 5,731,597 to Lee et al. illustrates a method, which is incorporated by reference herein in its entirety. Nanotubes can be formed by electric discharge, pulsed laser ablation, chemical deposition, and other methods as known by one of ordinary skill in the relevant arts and equivalents. Nanowires can be grown by several methods, for example electro-deposition. Field emitter arrays (FEA) can include array of the field emitters, for example millions, sometimes with various pitches (distance between array element (individual field emitter)), for example on the order of a micrometer.

A conventional field emitter emits electrons forming a beam current. Several references discuss the characteristics of a beam current and methods of control, for example U.S. Published Application US2004/0183456 incorporated by reference herein in its entirety. Note that the beam current can be unstable due to contaminants on the field emitter tip, which changes the electric field characteristics near the tip. The voltage difference between the gate layer 330 and the field emitter tips 340 (gate to tip voltage) can be on the order of volts (e.g., 1 to 10000V), with beam currents on the order of micro to nano amps, depending upon the environment in the emitter chamber (B) (FIG. 2B). Typically the distance between the emitter tip 340 and the gate layer 330 can be 0.01 to 100 micrometers, with typical values below 10 micrometers. Note that the parameters discussed, herein with respect to spacing voltages and materials are intended for illustrative discussion only and are not intended to limit exemplary embodiments. For example a gate to tip voltage of 15 V can produce a beam current on the order of 75 nA when the spacing is on the order of 5 micrometers.

At least one exemplary embodiment can use a high pressure field emitter (FIGS. 3B to 3D) to insert electrons into an ambient environment at elevated pressures, even up to 1 atm (atmosphere, 101300 Pa) or higher. In a high pressure field emitter, according to at least one exemplary embodiment, the gate to tip voltage is sufficient to assure that the majority of emitted electrons pass through a barrier layer (e.g., 360*a*, 360*b*). Thus, in accordance with the discussion above the spacing between the field emitter tip (e.g., 340*a*) and the gate layer (e.g., 330*a*) can be changed, the gate to tip voltage changed, the emitter chamber (B) characteristics changed (e.g., a chosen pressure, inert gas insertion), and the thickness of the barrier layer (e.g., 360*a*, and 360*b*) can be changed.

EXAMPLE 1

Choosing a Layer Thickness to Pass a Majority of Emitted Electrons but Block Thermal Ambient Constituents For example the barrier layer can be chosen to be made of platinum, or carbon, where the thickness is chosen so that less than 1% of the ambient thermal (e.g., 1.2 eV) constituents (e.g., N2) can tunnel through the barrier layer in a given time, while over 50% of the field emitted electrons at a chosen, reference voltage (e.g., 102 eV) can tunnel through in the same time. Note also that the barrier layer (e.g., 360*b*) can also be the gate layer.

Thus, the ambient environment (A) can effectively be separated from the emitter chamber (B). Additionally if it is suspected that the emitter camber's pressure has risen to a level that it is desirable to reduce, for example over $10^{-7}$ Torr, then the field emission electron energies can be chosen to ionize constituents in the emitter chamber (B), then with a reversed gate to tip voltage those ionized constituents can be accelerated out of the chamber through the barrier layer (e.g., also 360*a*).

Thus with an oscillating voltage (oscillating electrons at a chosen ionizing energy) ionization of emitter chamber contaminants can occur, and then with a reversed voltage the positive ions removed from the emitter chamber (B) to facilitate the reduction of the emitter chamber (B) pressure to a more desirable level. Thus, a high pressure field emitter in accordance with at least one exemplary embodiment can pump ambient constituents and other contaminants that happen to accumulate in the emitter chamber (B) out of the emitter chamber (B). Several non-limiting example field emitters will be discussed below, and then at least one non-limiting method of fabrication. A discussion of the materials will not be made in detailed below since such discussion has already been made above with respect to similar parts. The barrier layer 360*a* can be either conductive (FIG. 3C) or insulating (FIG. 3B) or semiconductive, depending upon the particulars of the design, thus just about any material can be used.

To calculate the minimum design thickness of the barrier layer (e.g., 360*a*) one can approximate the electron penetration depth, for example by:

$$x(\mu m) = \frac{0.1 E_0^{1.5}}{\rho} \tag{1}$$

Where $E_0$ is the accelerating voltage in keV (e.g., the gate to tip voltage). ? is the density of the barrier layer 360*a* (g/cm$^3$). For example a gate to tip voltage of 15 keV, using a silicate material for the barrier layer 360*a*, 2.5 g/cm$^3$ gives a thickness of 2.3 µm. Note that for a 1.2 eV thermal ambient energy particle (e.g., electron, ion, neutral atom or molecule) the thickness is on the order of $10^{-6}$ µm. Note also that neutrals can have cross sections thousands of times less than a charged particle, so to accurately determine the penetration of neutrals compared to charged particles the relative cross sections can be used, where the cross sections have been cited in numerous literature.

Suppose one wishes to have field emission electrons with 100 eV when they pass into the ambient environment (A). Then if we assume that half the energy is lost going through the barrier layer then we start with a gate to tip voltage of 200 Volts (200 eV with the electrons). Then we calculate the thickness required to stop 100 eV electrons (i.e., the thickness needed to bleed off ½ the energy). The calculated design thickness of the barrier layer is approximately 0.001 micrometer.

EXAMPLE 2

Choosing the Layer Thickness Then Calculating the Absorbed and Emitted Energies

Small thicknesses can be difficult to deposit precisely, thus for a second computational example, lets assume that we wish to use a 10 micrometer thickness film, using silicate material (2.5 g/cm$^3$). Such a barrier layer will approximately stop a 39.5 eV electron. Thus one can design the gate to tip voltage to be 140 Volts to provide about 100 eV electrons into the ambient environment. Note also that as the electrons pass through the barrier layer beam spreading can occur, which can actually be of use when trying to form a plasma in the ambient environment. When a more directed beam is needed (e.g., for display systems) a higher gate to tip gate voltage will tend to reduce the relative beam spread.

For the non-limiting example discussed above approximately 40 eV per electron is deposited in the barrier layer, heating the barrier layer. If the barrier layer is conductive the heat can be conducted away. The heat can also be transferred to the ambient environment (via convection, conduction or radiation). In the non-limiting example discussed, if we assume that 40 eV is deposited in the barrier layer 360a per electron, then the total amount of energy deposited will be a function of the beam current. For illustrative purposes lets assume that 1 microamp current is being produced by the field emitted electrons. Then the total power deposited can be calculated as:

$$W_d = 40 \text{ eV}(1.6\times 10^{-19} J/eV)(1\times 10^{-6} \text{ Amp}) \quad (2)$$
$$\left(\frac{1C/\sec}{\text{Amp}}\right)\left(\frac{1 \text{ electron}}{1.6\times 10^{-19} C}\right)\left(\frac{1 \text{ Watt}}{J/\sec}\right) \approx 4\times 10^{-5} W$$

which, for a microamp current is equivalent to $6.25\times 10^{12}$ electrons/sec being deposited. To cool the barrier film heat conduction, radiation, and/or convection should be equal to or greater than $4\times 10^{-5}$ W for the given example values. For example suppose we would like radiative transfer to cool the thin film. Then one starts with the $4\times 10^{-5}$ W and works backwards to arrive at a desired emissivity. If radiative transfer alone can't provide the full cooling then convection and/or conduction can be added to arrive at an equilibrium condition (energy radiated, conducted, and convected=total power deposited). Continuing with the example lets assume that the radiative area is only one side of the thin film the side facing the ambient environment (A). Lets also assume the emitter chamber (B) has a horizontal barrier layer 360a extend of 1 micrometer diameter for a surface area of $\pi(D/2)^2=7.85\times 10^{-13}$ m$^3$. The radiative power can be expressed as:

$$W_{rl=e\sigma AT^4}=e(5.67\times 10^{-8} \text{ W/m}^2\text{K}^4)(7.85\times 10^{-13}\text{ m}^2)T^4 = 4\times 10^{-5} \text{ Watt} \quad (3)$$

If we assume a value of the emissivity of 1.0 then the equilibrium temperature for radiation cooling only is 5475 K. Thus conduction and convection might be needed and the material of the barrier film made of a high melting temperature in this particular example. Additionally the surface area can be increased by the addition of fins.

EXAMPLE 3

Choosing a Layer Thickness Based Upon Operating Temperature

Often the operating temperature is determinative, so one can start there and work backwards. Thus, one can work backwards from a design temperature and desired current and obtain the energy per electron deposited, then calculate the thickness of the barrier layer needed. Then the thickness can be check with the operating pressure difference between the emitter chamber (B) pressure and the ambient environment (A) pressure to see if structurally the film can resist the pressure difference without rupture, the needed stress can narrow the selection of materials. For this example lets assume that we don't want the temperature to be greater than 300K. Lets assume the emissivity is 0.5, and the desired current is $1\times 10^{-8}$ Amp. Using equation (3) with the radiative between standard temperature of 273K we get:

$$W_r=e\sigma AT^4=(0.5)(5.67\times 10^{-8} \text{ W/m}^2\text{K}^2)(7.85\times 10^{-33}\text{m}^2)$$
$$(300^4-273^4)=5.66\times 10^{-33} \text{ Watt} \quad (4)$$

Now one can use equation (2) to obtain the eV deposited, which for this non-limiting example can be expressed as:

$$W_d = ?eV(1.6\times 10^{-19} J/eV)(1\times 10^{-8} \text{ Amp}) \quad (5)$$
$$\left(\frac{1C/\sec}{\text{Amp}}\right)\left(\frac{1 \text{ electron}}{1.6\times 10^{-19} C}\right)\left(\frac{1 \text{ Watt}}{J/\sec}\right) \approx 5.66\times 10^{-11} W$$

Solving the ?eV one gets about 0.00566 eV. Such calculations can continue until a reasonable temperature and electron deposition is acquired.

Note however that electron energy deposition in the film will not mean that neutrals and ions in the ambient environment greater than that energy can pass through the film.

The barrier film thickness for the example where the deposited electron energy is 0.00566 eV can be calculated from equation (1), with an assumption of a gate to tip voltage, which we will choose at 100 eV, which can be expressed as:

$$x(\mu m) = \frac{0.1 E_0^{1.5}}{\rho} = \frac{0.1(0.00566)^{1.5}}{2.5} = 1.7\times 10^{-5} \mu m \quad (6)$$

The discussions above are meant to illuminate the cyclic calculations that can follow the determination of materials to be used, gate to tip voltages to use, and barrier thicknesses to use. For example an assumption can be made and the temperature calculated, if the temperature is too high, a new assumption on the temperature can be made and the calculations worked backwards to obtain the energy deposited.

EXAMPLE 4

Determining the Thickness Needed to Stop a Thermal Neutral, Ion and/or Electron, Then Calculating the Film Thickness To this point the calculations have centered around the emitted electrons, however we could start calculations with the ambient thermal temperature of the constituent neutrals and ions and work forwards and calculate the minimum energy that electrons will need to penetrate the barrier. The ambient environment is typically made of neutral atoms and molecules of an appreciable amount of electrons to start with (Thermal temperatures are approximately 0.025 eV).

Figure 1A:
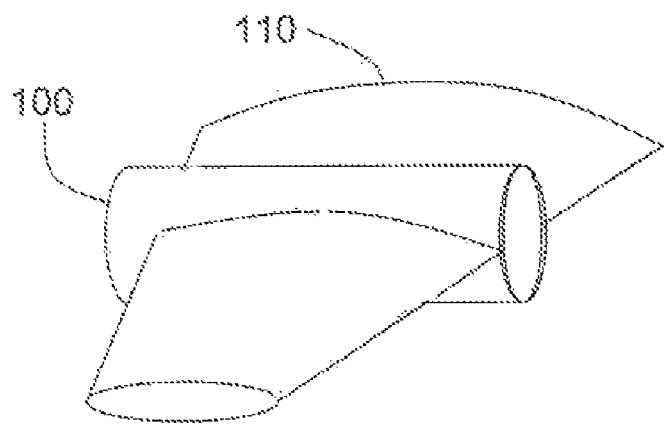
FIGS. 1A and 1B illustrate a conventional propulsion system.
Figure 1B:
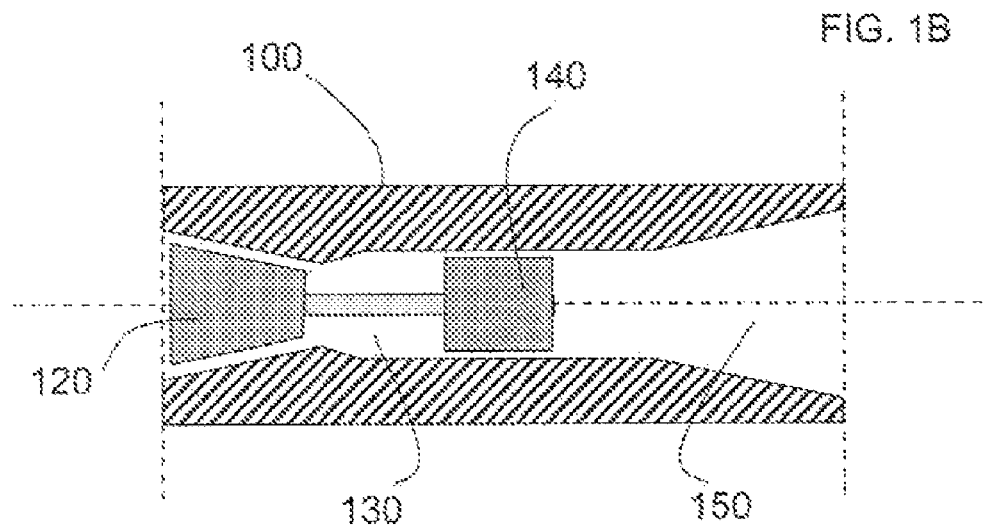
Figure 1C:
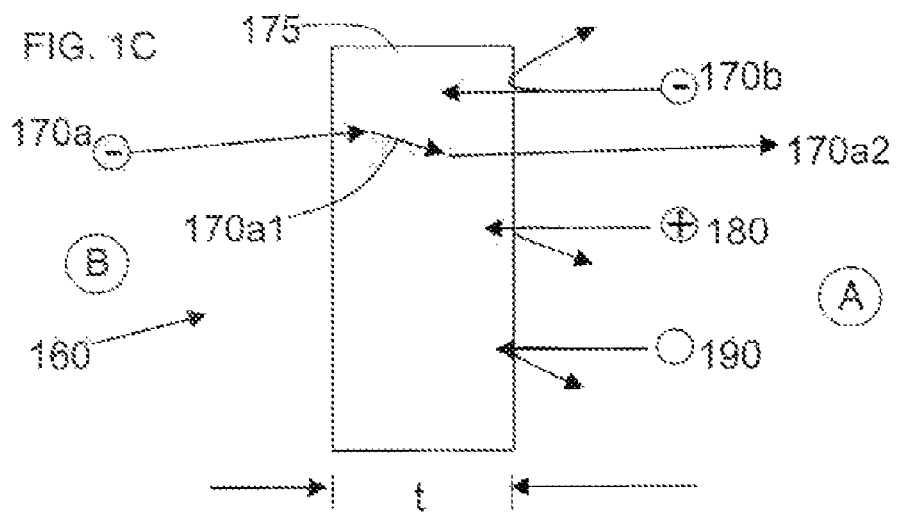
FIG. 1C illustrates a thin film barrier that separates a low pressure system from a higher pressure system.

FIG. 1C illustrates a barrier layer 160 including a barrier film 175. The barrier film 175 has a thickness "t" and separates two regions (A) and (B). Region (B) can be a high vacuum environment (referred to as the field emitter chamber region), which is separated from an ambient environment region (A). Region (B) can include electrons 170a (e.g., field emitted electrons) that have sufficient energy to pass through 170a2 the barrier film 175, albeit with possible deflections 170a1. Region (A) can include ambient constituents (e.g., electrons 170b, ions 180, and neutrals 190) some of which can have energies too low to pass through the barrier thickness in appreciable numbers (e.g., less than 50% pass through), The following formulas can be used to approximate the penetration depth or stopping power of various neutrals, ions, and electrons. The following formulas are non-limiting examples that can be used to calculate the stopping distances of various energies and constituents.

Formula Example 1

Protons and Antiprotons

The following harmonic equation for the stopping power has been used to examine the stopping power (keV/μm) of protons and antiprotons (*Direct measurements of the stopping power for antiprotons of light and heavy targets*, S. P Moller et al., Physical Review A, Vol. 56, No. 4, October 1977) incorporated herein by reference in its entirety:

$$\frac{-dE}{dx} = \frac{4\pi e^4 NZ_2}{mv^2} Z_i^2 L \quad (7)$$

Where, N is the target density, $Z_2$ is the target atomic number, $Z_1$ is the projectile charge, v is the projectile velocity, and L is the Bethe stopping function. In general the Bethe stopping function can be expressed as:

$$L = L_0 + Z_1 L_1 + Z_1^2 L_2 + \quad (8)$$

Where $L_0$, $L_1$, and $L_2$ are various functions of the Bohr velocity $$v_0 = \alpha c \approx \frac{1}{137} c,$$

mean ionization, and other projectile and target properties, $L_1$ however is the distant collision Barkas effect and is related to the polarization of the medium induced by the projectile, thus negatively charge projectiles will have a lower stopping power, for example a proton uses $L_0 + L_1 + L_2$ to calculate the stopping power, while an antiproton uses $L_0 - L_1 + L_2$. Thus for example if both have a kinetic energy of 20 keV, then the proton has a stopping power of 200 keV/μm while an antiproton has a stopping power of 50 keV/μm.

Formula Example 2

Other Particle Formulas

The Bethe-Bloch formula has been used to calculate the stopping power for energetic projectiles with variations for lower energies. Additionally the continuously slowing down approximation (CDSA) has been calculated for the stopping range. For example a 100 eV electron will have a stopping range of about 50 angstroms in gold.

Simulations

FIG. 2A illustrates a simulation of electron penetration of a 10 nm barrier layer. 1 KeV electrons from the field emitter chamber side are incident on the barrier layer. As can bee seen in the simulation, a majority of electron trajectory passes through the barrier layer. FIG. 2B illustrates that the majority of penetration electrons have an energy of about 0.83 KeV, the remainder of the energy being deposited in the barrier layer.

FIG. 2C illustrates a simulation of electron penetration of a 100 nm barrier layer. 5 KeV electrons from the field emitter chamber side are incident on the barrier layer. As can bee seen in the simulation, a majority of electron trajectory passes through the barrier layer. FIG. 2D illustrates that the majority of penetration electrons have an energy of about 4.45 KeV, the remainder of the energy being deposited in the barrier layer.

Determining Thickness Needed to Withstand Pressure Differences

The next issue is that any barrier layer will have to be strong enough to support the pressure difference. As discussed in Neukermans (U.S. Pat. No. 4,468,282) incorporated herein in its entirety, there are several materials that can be used that can withstand the pressure difference between a vacuum and atmospheric pressure (approximately 14.7 pounds per square inch). Thus although not discussed in detail the pressure stress considerations with respect to the film material chosen would be known by one of ordinary skill in the arts.

Examples of High Pressure Field Emitters in Accordance with at Least One Exemplary Embodiment:

Although the examples of exemplary embodiments utilize modifications of a "Spindt type" field emitter, the concepts of exemplary embodiments can be used in other types of field emitters.

Figure 3B:
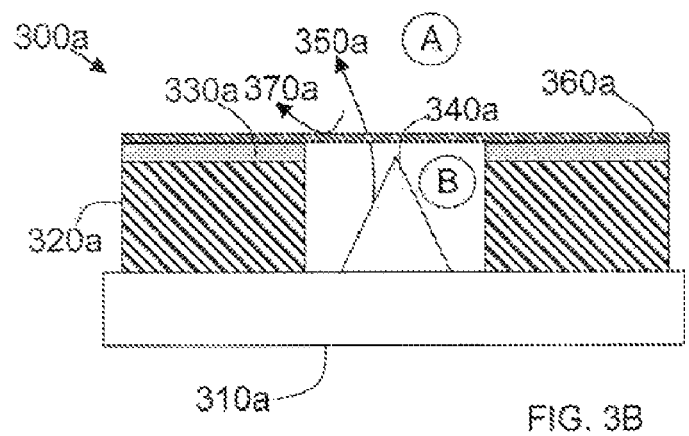
FIGS. 3B-3D illustrates a high pressure field emitter in accordance with at least several exemplary embodiments.

FIG. 3B illustrates an example of at least one exemplary embodiment 300a. A barrier layer 360a is deposited on the gate layer and covering the field emitter chamber region (B). The thickness of the barrier layer 360a is chosen, as discussed above, to allow a majority of field emitted electrons 350a to pass through the barrier layer 360a from the chamber region (B) to the ambient environment (A) with a desired energy and reduce the transmittance 370a of ambient constituents from passing through the barrier layer 360a into the chamber region (B). Applying a voltage on the gate layer 330a controls the current flowing through the semiconductor layer 310a to the field emitter tip 340a. The gate layer 330a is separated from the substrate layer 310a by an insulating layer 320a.

Figure 3C:
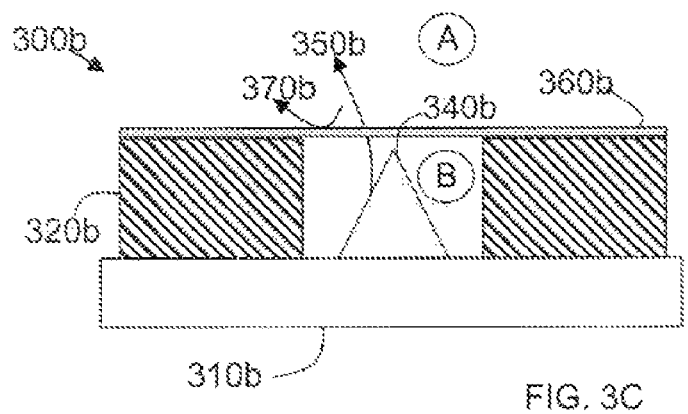

FIG. 3C illustrates an example of at least one further exemplary embodiment 300b. A barrier layer 360b in this exemplary embodiment also acts as the gate layer and covers the field emitter chamber region (B). The thickness of the barrier layer 360b is chosen, as discussed above, to allow a majority of field emitted electrons 350b to pass through the barrier layer 360b from the chamber region (B) to the ambient environment (A) with a desired energy and reduce the transmittance 370b of ambient constituents from passing through the barrier layer 360b into the chamber region (B). Applying a voltage on the gate layer and barrier layer 360b controls the current flowing through the semiconductor layer 310b to the field emitter tip 340b. The gate and barrier layer 360b is separated from the substrate layer 310b by an insulating layer 320b.

Figure 3D:
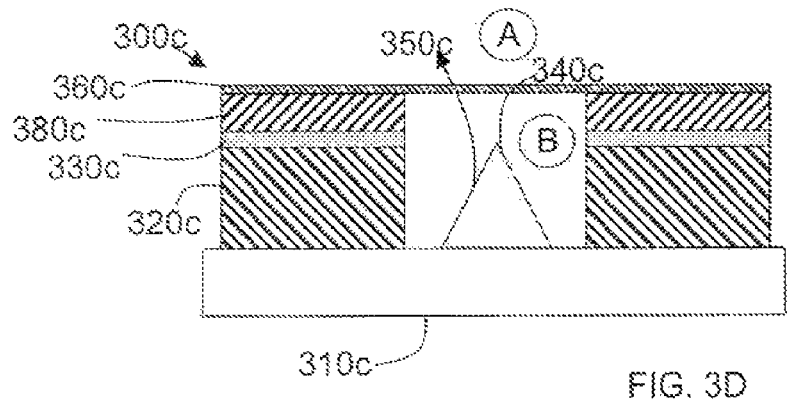

FIG. 3D illustrates an example of at least one further exemplary embodiment 300c. A barrier layer 360c is deposited on an insulating layer 380c, which is deposited on a gate layer 330c and covering the field emitter chamber region (B). The thickness of the barrier layer 360c is chosen, as discussed above, to allow a majority of field emitted electrons 350c to pass through the barrier layer 360c from the chamber region (B) to the ambient environment (A) with a desired energy and reduce the transmittance of ambient constituents from passing through the barrier layer 360c into the chamber region (B). Applying a voltage on the gate layer 330c controls the current flowing through the semiconductor layer 310c to the field emitter tip 340c. The gate layer 330c is separated from the substrate layer 310c by an insulating layer 320c.

Other variations are possible within the scope of exemplary embodiments where a barrier layer is deposited to isolate the chamber region (B) from the ambient environment (A).

FIGS. 4A-4H illustrate a method for fabricating the example of the exemplary embodiment illustrated by FIG. 3B. Other similar fabrication methods can also be enacted to develop the examples illustrated.

Figure 4A:
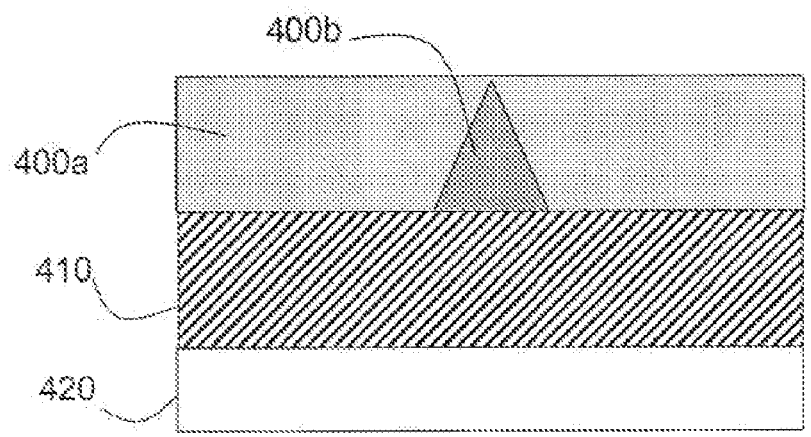
FIGS. 4A-4J illustrates a first method in accordance with at least one method of fabrication of a high pressure field emitter in accordance with at least one exemplary embodiment.
Figure 4B:
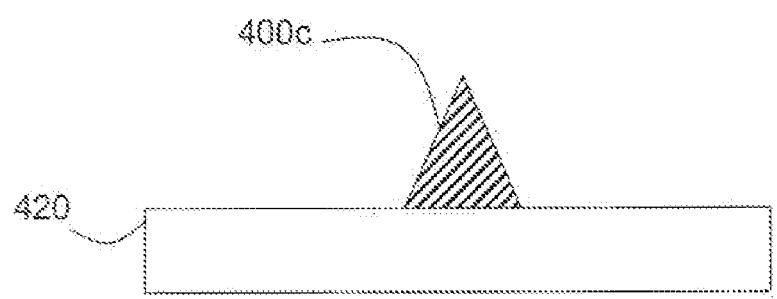
Figure 4C:
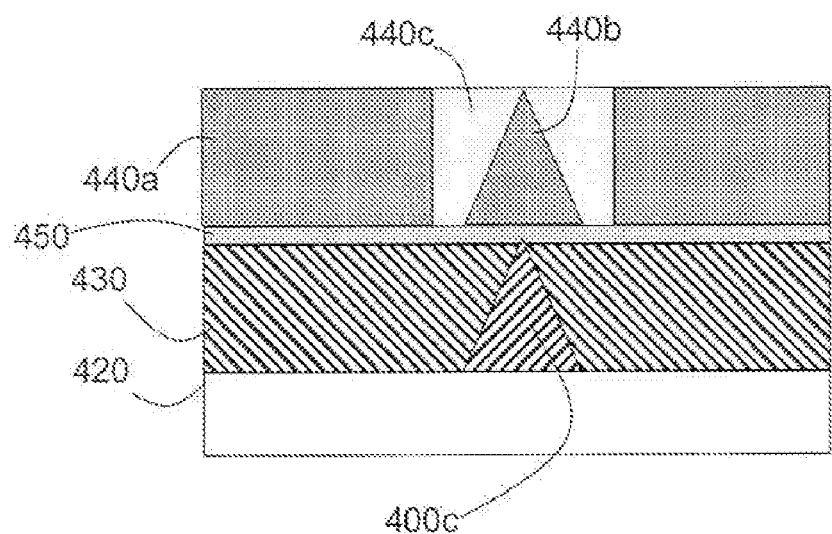
Figure 4D:
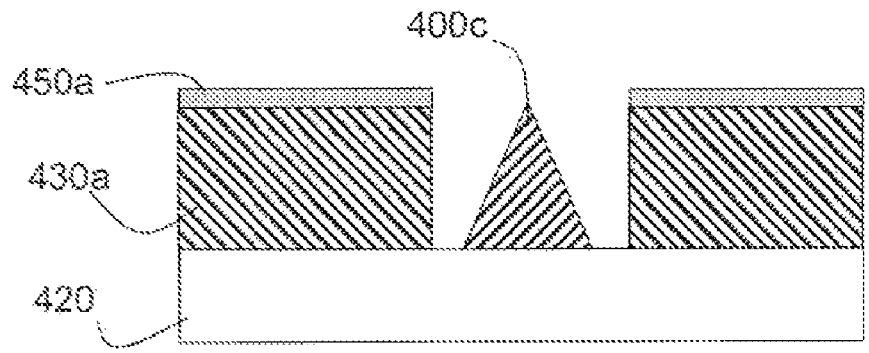
Figure 4E:
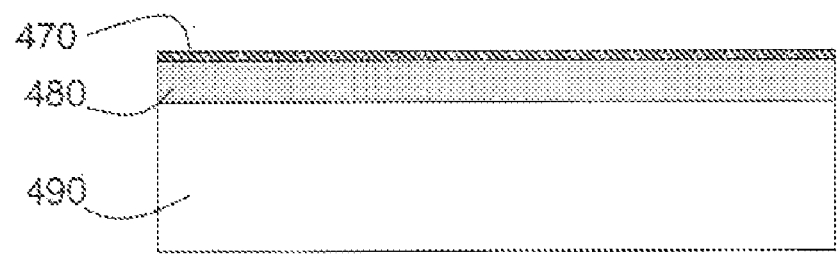

FIG. 4A illustrates a photoresist layer comprising an exposed portion 400b and an unexposed portion 400a is deposited on an emitter material layer 410 which is in turn deposited on a substrate 420. The exposed portion 400b is shaped like the field emitter tip and is etched into the emitter material layer 410 forming an emitter tip 400c on the substrate 420 (FIG. 4B). An insulating layer 430 is deposited on and covers a portion of the emitter tip 400c. Then a gate layer 450 is deposited on the insulating layer 430 (FIG. 4C). On top of all these layers is deposited another photoresist layer which has exposed portions 440a and 440b and unexposed portions 440c (e.g., by illuminating a grayscale reticle with light). The exposed portions are etched to obtain the final gate layer 450a, the emitter tip 400c, the insulating layer 430a all on the substrate 420. At this point the barrier layer is not deposited to separate the chamber region (B) from the ambient environment (A).

Figure 4F:
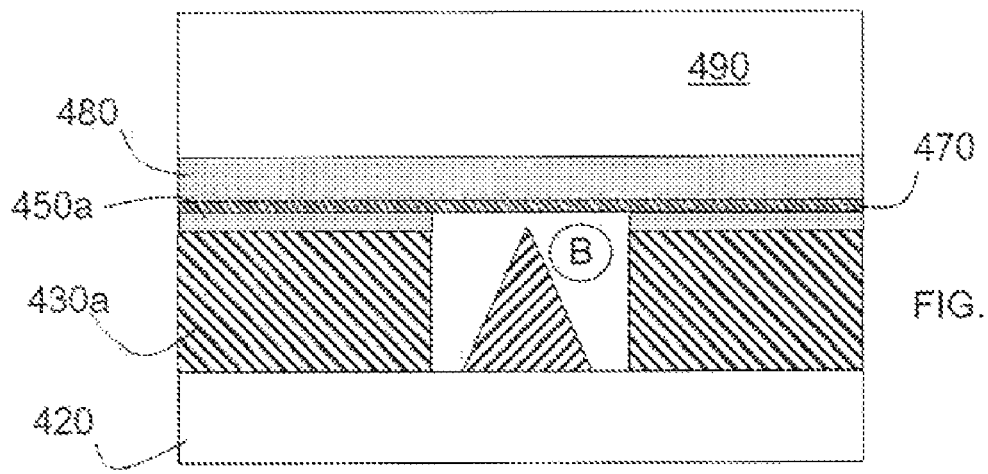
Figure 4G:
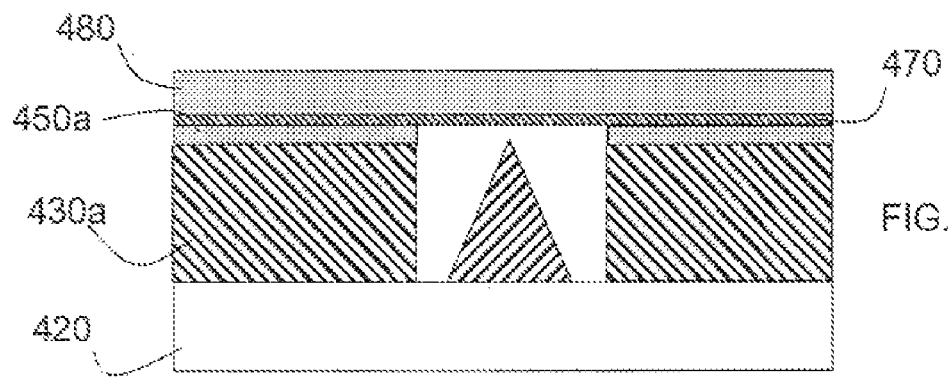

To develop a thin enough barrier layer, the barrier layer 470 can be deposited on a separate stop layer 480, which itself can be deposited on a base layer 490 forming a multilayer structure. The barrier layer 470 can be deposited to the desired thickness. The multilayer structure can be flipped and attached to the structure formed in FIG. 4D in a low pressure environment designed for an chamber region (B) (FIG. 4F). The base layer 490 can be selectively etched to the stop layer 480 (FIG. 4G), (e.g., the stop layer 480 can be metallic and the base layer Si which can be plasma etched to the stop layer 480). The stop layer 480 can also be etched selectively (e.g. selective wet etching, e.g., chemical Fluoride etching up to the barrier layer 470), leaving the barrier layer covering the structure illustrated in FIG. 4G. Similar processes can be used to fabricate the other exemplary embodiments using a combination of dry and wet etching as known by one of ordinary skill in the relevant arts. For example $CF_4$ does not appreciably etch $SiO2$ while it does etch Si. $CF_4$ also does not etch particular metals such as Al (e.g., used as a stop layer), while $Cl_2$ or $Br_2$ is used instead. For example "Principles of Plasma Discharges and Materials Processing" by Michael A. Lieberman and Allan J. Lichtenberg (ISBN 0-471-00577-0), discusses many plasma etching techniques, materials and etch rates, and is incorporated by reference in its entirety.

In at least one exemplary embodiment a portion 480 (e.g., a circular ring etch) around the barrier film 470 can be etched (FIG. 4I) and then filled 490 (FIG. 4J) to seal the chamber region (B) from the ambient environment (A) and help in securing the barrier layer 470 to the substrate 430a and gate layer 450a. Likewise additional etches (not shown) of holes and subsequent fillings can secure additional layers depending upon the depth of the hole and filler.

Figure 4H:
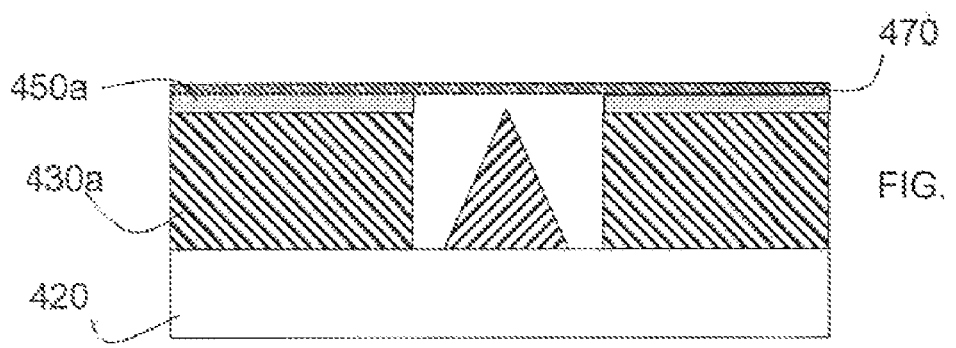
Figure 4I:
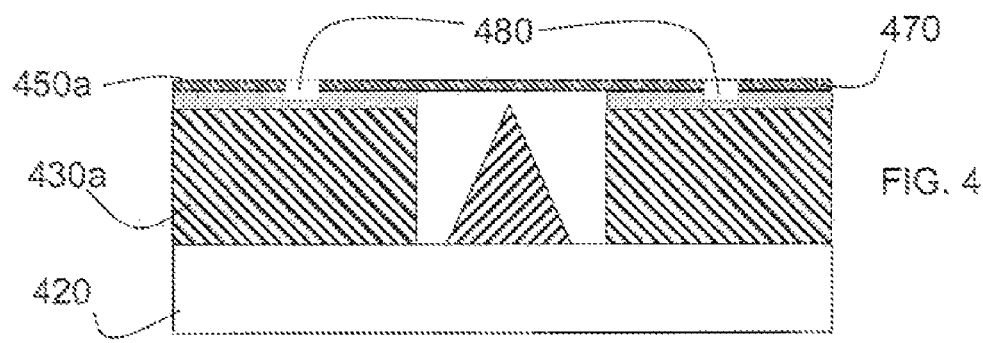
Figure 4J:
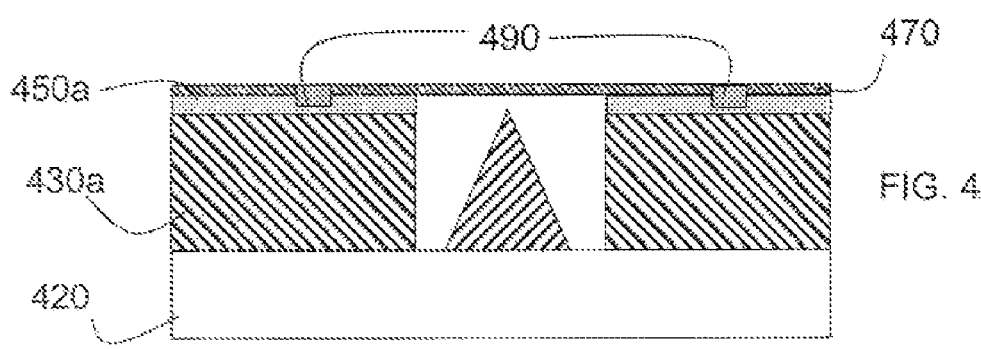

Each field emitter (FE) as illustrated in FIG. 4H can be arranged in a field emitter array (FEA) 500 having a FE base 510 with regions 520 through which field emitter electrons pass into the ambient environment (FIG. 5A).

FIG. 5B illustrates a magnetic field device 530 in accordance with at least one exemplary embodiment. Magnetic coils 538, which can include a core surrounded by wound wire can be arranged in an array on an array base 540. The array of coils 538 can be covered with a top 532, and sides 534, which can be attached 536 to the array base 540. The top 532 can let magnetic induction (referred to as magnetic field) pass through. The magnetic flux "Ya" generated by a coil can be mapped "Xa" through the top 532. The magnetic field device 530 can generate a magnetic field (e.g., magnetic field line Ba) into an ionization/plasma region. The coils (e.g. solenoid) can include a core surrounded by a loop of wire.

FIG. 5C illustrates two such coils 538a and 538b, which generate magnetic field lines 544a and 544b respectively. A current carrying wire 542 can wrap around the cores to increase or decrease the magnetic flux (by alternating the direction of current flow). Switches S11 and S12 can optionally be included to bypass a coil that might have faulty wiring. Other arrangements can be made within the scope of exemplary embodiments as known by one of ordinary skill in the relevant arts. The strength of the magnetic fields can be expressed as:

$$B(z) \approx \frac{\mu N I a^2}{2z^3}, \qquad (9)$$

where $\mu$ is the permeability (e.g., in a vacuum of $4\pi \times 10^{-7}$ (N/Amp$^2$)). I is the current (in Amps) around the loop, where N is the number of loops, "a" is the radius of a coil loop, and "z" is the distance from the end of the coil (e.g., along the field line direction "Ba"). Generally $\mu$ in a vacuum can be used and then a separate magnetic field added due to the magnetic field added by a ferromagnetic core material, which in totality can be equated to equation (7) using $\mu$, or the magnetic permeability of the core material. To increase the number of loops, concentric shells of coils can be set within each other. For example FIG. 6 illustrates a magnetic field coil in accordance with at least one exemplary embodiment.

In the example illustrated, three concentric coils (e.g., 610, 611, and 613) are illustrated, providing N1, N2, and N3 turns respectively. Each coil surrounds a ferromagnetic shell (e.g., 601 and 603) or a ferromagnetic core 605, providing increased magnetic field output. Each shell can be separated by a $\mu$ metal sheath (e.g., 602, 604) to avoid an inner coil from creating an opposing field to an outer coil, thus each shell or coil produces a component magnetic field, for example B3 for the innermost coil 613, B2 for the middle coil 611, and B1 for the outermost coil. FIG. 6 illustrates a slewed view, where in actually each inner shell fits within the outer shell, (e.g., the shells and sheath, fro the innermost to the outer most, move Z4, Z3, Z2, and Z1 respectively) to create a coil magnetic field generator 600 can be used in the magnetic field device 530. Each coil has input and output leads (e.g., L1A, L1B, L2A, L2B, L3A, and L3B) through which current can be driven to produce a magnetic field. Note that in at least one exemplary embodiment no $\mu$ metal sheath is used and the respective fields add, where the opposing fields as typically generated by a solenoid is much less outside the coil. For example the opposing field outside and generated by the middle coil 611 is less than the field generated within the outer coil 610.

Figure 7:
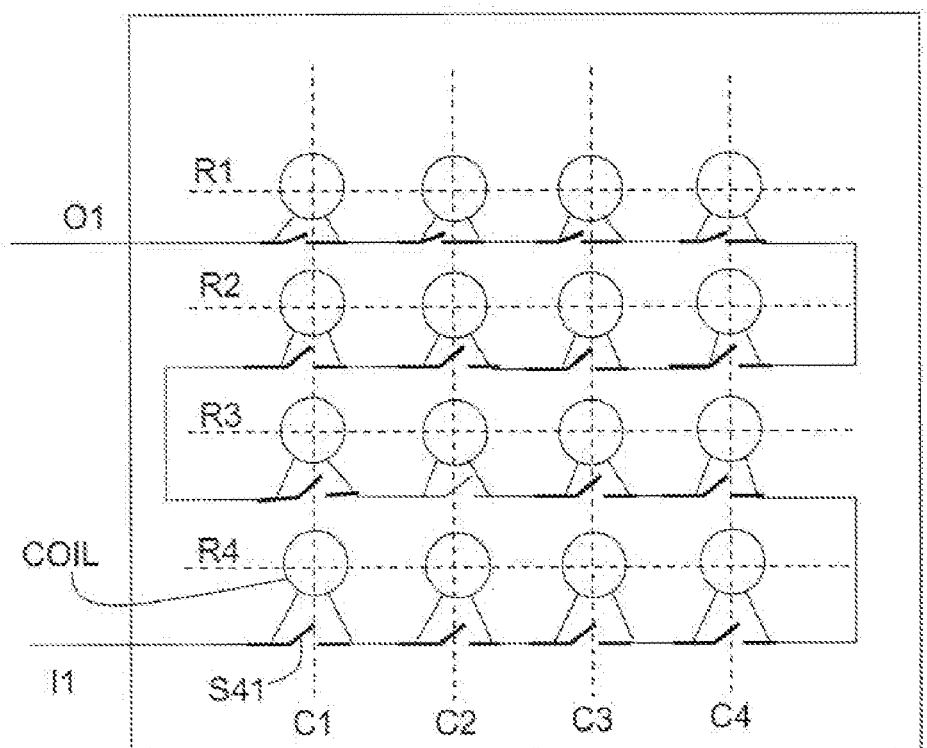
FIG. 7 illustrates a circuit for feeding current to the core coils of a magnetic field device in accordance with at least one exemplary embodiment.

Each coil can be driven individually, in parallel, or in series. An example of a serially driven coil array circuit is illustrated in FIG. 7. In the non-limiting example illustrated, 16 coils C1R1 to C4R4 are driven serially with an input I1 and an output O1. In the example illustrated, switches (e.g., S41), can be instituted to bypass any coil that is damaged.

Figure 8:
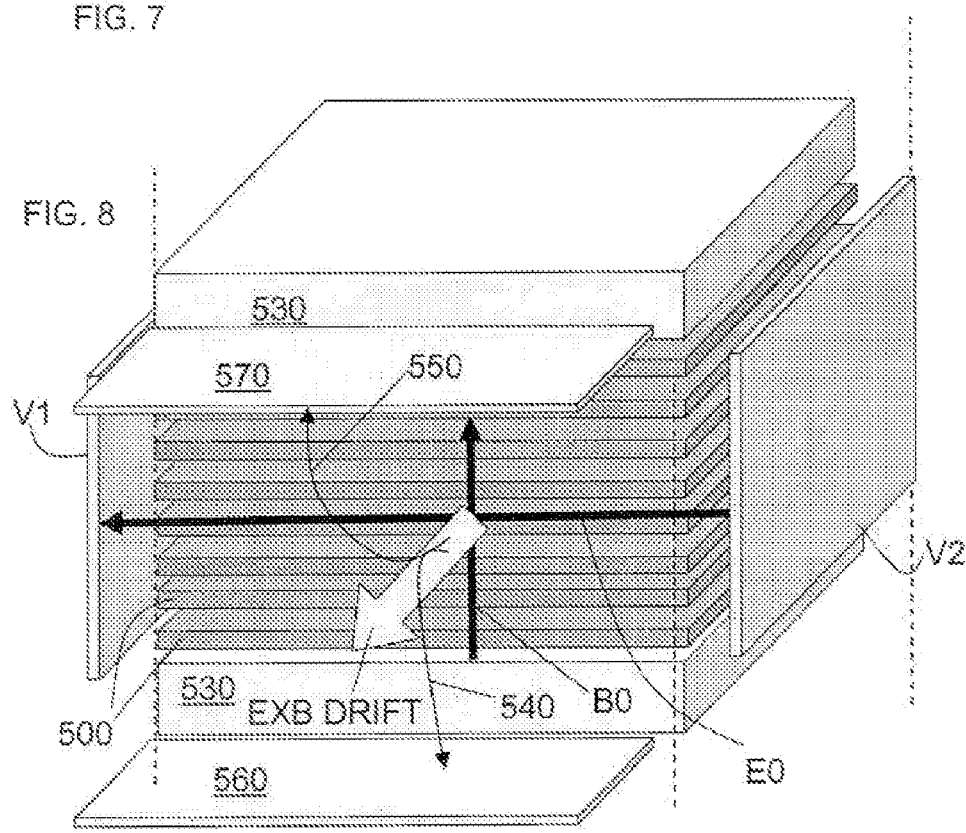
FIG. 8 illustrates a propulsion stack in accordance with at least one exemplary embodiment where the propulsion stack includes excess current bleed off plates, and electric field generating plates.

An ExB engine according to at least one exemplary embodiment is illustrated in FIG. 8. The engine can include: two magnetic field devices 530; with a stack of field emitter arrays 500 between the magnetic field devices 530; an electric field device, for example two voltage plates V1 and V2, also situated where the field emitter arrays 500 are between the two voltage plates; and an excess charge accumulation device, for example collector plates 570 and 560 which can have a voltage difference so that excess positive charges (e.g., 550) are collected by one collector plate (e.g., 570) while the excess negative charges (e.g., 540) are collected by the other collector plate (e.g., 560). Note that between field emitter arrays 530 are gaps where electrons ionize the medium between arrays forming a plasma region. The plasma region is accelerated in the ExB direction (the negative and positive constituents are accelerated in the same direction). During the acceleration the ionized constituents (e.g., N2+, e, O2+) can recombine to a neutral constituent (e.g., N2, O2), with an extra electron (used for ionization) is left over. The excess collection plates (e.g., 560, 570) collect the excess electrons and any ions that have not recombined.

Other methods of ionization and plasma generation can be used, and further examples using ionizing light, and charged fluid evaporation, will be discussed later. In the present example an electric field E0 is created by the two voltage plates having a voltage difference, and the magnetic field B0 is created by the magnetic field device 530. The direction of the fields (E0 and B0) can be varied, for example by reversing the current in the coils of the magnetic device 530 and varying the voltage difference between plates V1 and V2. Any plasma in the field regions will be ExB drifted imparting an impulse in the devices generating the fields as discussed in Ser. No. 10/441,638 filed 20 May 2003. While ExB drifting a portion of the plasma will recombine becoming neutral at which point that portion will no longer be subject to the electric and magnetic fields. Some of the plasma may not have recombined before leaving the field region and thus will be collected by the excess charge plates (e.g., 560 and 570).

Figure 9:
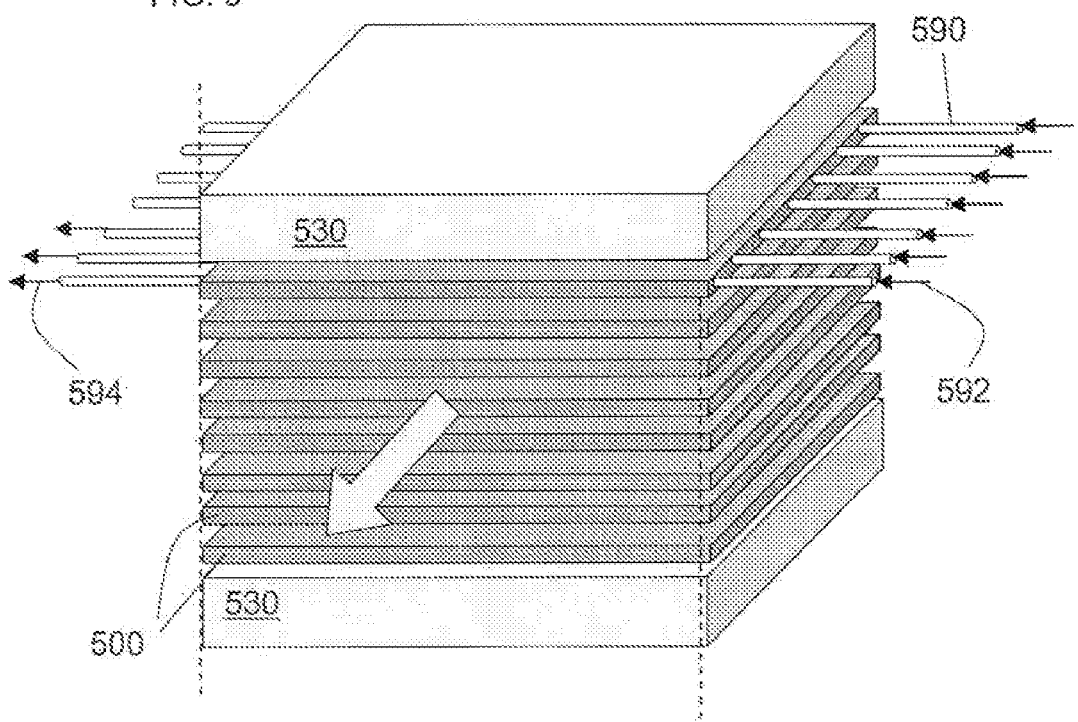
FIG. 9 illustrates a portion of the propulsion stack illustrated in FIG. 8, where coolant tubes aid in the cooling of the propulsion stack.

As discussed above if high pressure field emitters are used to create the plasma then the field emitter arrays 500 can heat up. Coolant tubes can be used to cool the field emitter arrays. FIG. 9 illustrates a portion of the engine illustrated in FIG. 8, where coolant tubes 590 (shown for only one field emitter array) are used to cool the field emitter arrays in the engine. The coolant tubes 590 have an intake 591 at a particular temperature and an output 594 with a higher temperature that that of the intake 591. Note that the number and arrangement of the coolant tubes can vary in accordance with various exemplary embodiments.

Figure 10:
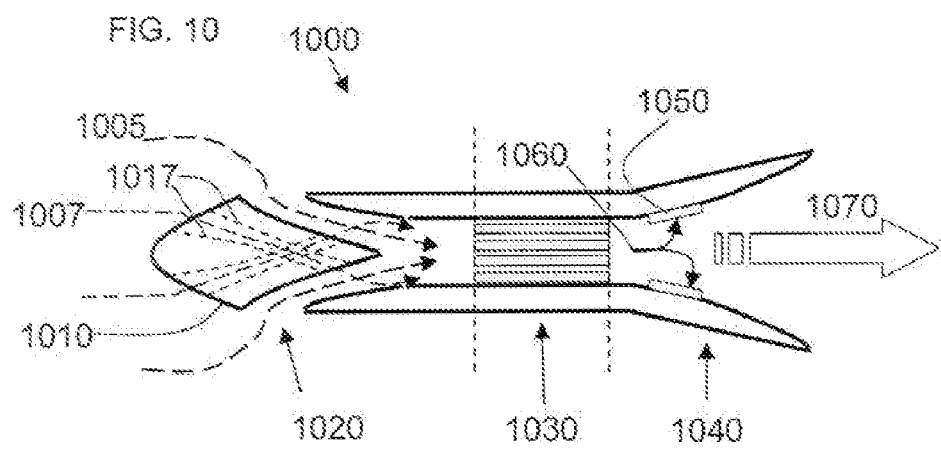
FIG. 10 illustrates an engine configuration in accordance with at least one exemplary embodiment.

The engine illustrated in FIG. 8 and/or FIG. 9 and other exemplary embodiments can be implemented in a vehicle propulsion system 1000. FIG. 10 illustrates a vehicle propulsion system 1000 in accordance with at least one exemplary embodiment. The vehicle propulsion system 1000 can include an intake section 1020, a plasma ExB section 1030, and an expansion and charge neutralization section 1040. The intake section can include a front streamlining section 1010, which can have various air inlets 1017, which facilitates air flow 1007 into the intake section. Additionally in the example illustrated additional intake slots can facilitate the intake of additional air flow 1005. The intake flows can combine in the intake section 1020, and compressed if necessary (e.g., via a separate compression section or via shock design). The intake flow enters the plasma ExB section 1030, where the flow is partially turned into a plasma which can be ExB drifted through the plasma ExB section 1030. The ExB drifted plasma enters the expansion and charge neutralization section 1040, where the portion of the drifted plasma which has not recombined to a neutral state upon entering the section 1040, is directed 1060 to the excess charge collection plates 1050 (e.g., via voltage difference between collection plates 1050). The drifted flow 1070 imparts an impulse to the vehicle propulsion system providing propulsion for any attached vehicle. In at least one exemplary embodiment the plasma is produced from a portion of the ambient environment. In yet another exemplary embodiment a stored medium is injected into the plasma ExB section 1030 which is then ionized.

II. Second Exemplary Embodiment
II.A. Electromagnetic Plasma Formation Source Ionization of an atom can be generally expressed as:

$$E_o = \frac{2\pi^2 e^4 m k^2}{h^2} \frac{Z^2}{n^2} \tag{10}$$

Where e is the charge of an electron $1.6 \times 10^{-19}$ C, m is the mass of an electron $9.11 \times 10^{-31}$ Kg, $k = 1/4\pi\epsilon_0 = 9.00 \times 10^9$ Nm$^2$/C$^2$, $h = 6.63 \times 10^{-34}$ Js, Z is the charge on the nucleus, and 'n' is the quantum condition where n=1 is the ground state. For example the ionization of Hydrogen in the ground state is 13.6 eV, He is 54.4 eV, and for N (Z=7, outer electron on n=2 orbital) the ionization of an outer electron is about 14.53 eV. For air constituents, it takes about 15.58 eV to ionize an outer electron from N2, and about 12.07 eV to ionize an outer electron from O2. Generally photon energy from 5 eV to 20 eV will be sufficient to ionize both atoms and molecules. The equivalent photon energy can be calculated as:

$$E = hf = hc/? \tag{11}$$

Where "f" is the frequency of the light, 'c' is the speed of light $c = 3.0 \times 10^8$ m/s, and ? is the photons wavelength. For example photons with energies from 1 eV to 1000 eV have wavelengths from 1 μm to 1 nm respectively, from the near infrared to UV to soft X-ray. Where for the main range for ionization of air constituents photons range from 5 eV to 20 eV have wavelengths of about 500 nm and 90 nm respectively. Thus, for O2 and N2 typically about a 95 nm wavelength photon is needed for ionization, which corresponds to the UV. For comparison, visible light ranges from about 400 nm to 700 nm or violet to red respectively, corresponding to about 6 eV to 3 eV respectively. Thus, if a medium is composed of O2 and N2 then a photon generator can be used to ionize a portion of the medium. How far an ionizing photon penetrates into a medium depends on the medium's density. For example the mean free path in air for 1 atmosphere (number density of about $2.5 \times 10^{25}/m^3$) is about $6 \times 10^{-8}$ m. For other similar values see the Handbook of Chemistry and Physics, 75$^{th}$ Ed., ISBN 0-8493-0475.

Calculating the photon flux needed will depend on the recombination rate, the medium density, and the desired portion of ionization. U.S. patent application Ser. No. 10/441,638, incorporated herein by reference in its entirety, describes the recombination rate, and penetration depth when using electron ionization.

Table 1 lists several atoms and molecules and the associated ground state ionization energy needed and the associated wavelength in angstroms:

TABLE 1

Molecules/Atoms and Ionization Energies and Photon Wavelengths

| Mol/Atom | Ionizaton Energy (eV) | Ionization Photon Wavelength (Angstrom) | Photon Freq. (Hz) |
|---|---|---|---|
| NO | 9.25 | 1340 | $2.23 \times 10^{15}$ |
| O$_2$ | 10.08 | 1027 | $2.92 \times 10^{15}$ |
| H$_2$O | 12.60 | 985 | $3.04 \times 10^{15}$ |
| H | 13.60 | 912 | $3.29 \times 10^{15}$ |
| O | 13.61 | 911 | $3.29 \times 10^{15}$ |
| N | 14.54 | 853 | $3.51 \times 10^{15}$ |
| H$_2$ | 15.41 | 804 | $3.73 \times 10^{15}$ |
| N$_2$ | 15.58 | 796 | $3.76 \times 10^{15}$ |
| He | 24.58 | 504 | $5.95 \times 10^{15}$ |

One method of ionization is using a laser or light source with a photon frequency needed to ionize the ambient medium and/or medium in the plasma generation chamber. One such laser/light source in accordance with at least one exemplary embodiment is a photonic crystal laser using a cavity (e.g., of the appropriate size, see table 1) field with a gain material.

II.B. Illustrative Example of the Second Exemplary Embodiment (Photonic UV Source)

FIGS. 11A-11G is illustrate a non-limiting example of the second exemplary embodiment, where a plate (e.g., 500 in FIG. 9) includes multiple photonic crystal lasers of the ionizing frequency of the medium in the plasma generation chamber (e.g., 1030 of FIG. 10). The photonic crystal lasers illuminate the region between plates, where the spacing of the plates can be about the mean free path of a photon or more. The photonic crystal laser includes three main sections 1100a, 1100b and 1100c. FIGS. 11A, 11B, and 11C, illustrate top views of a bottom section 1100a, a middle section 1100b, and a top section 1100c respectively. FIGS. 11D, 11E, and 11F illustrate side views of the bottom section 1100a, 1100b, and 1100c respectively. FIGS. 11C and 11F illustrate the moveable photonic crystal 1150 with a cavity 1157 that can be moved in the top section 1100c. The moveable photonic crystal 1155 is moved to place the cavity 1157 above the gain region 1140, so that the cavity 1157 creates an allowable photon frequency band within the photon band gap of the photonic crystal 1150 and 1110. When the cavity 1157 is placed above the gain region 1140 the stimulated light in the gain region 1140 can then escape the photonic crystal 1100 and 1150 and pass through a transparent layer 1196 into the plasma generation chamber (i.e., a region where plasma is created).

Many methods can be used to move the moveable photonic crystal in and out of the top section 1100c, for example a groove 1175 and gear system 1170 is illustrated in FIG. 11F, while FIG. 11G illustrates the moveable photonic crystal 1150 attached to a vertical comb drive 1185. The vertical comb drive 1185 can move 1180a based on potential variations between opposing combs moving 1180b the cavity 1157 back and forth as needed.

The middle section 1100b includes two electrodes 1120, fed via leads 1130. The middle section 1100b also includes a gain region 1140, where the gain region 1140 creates stimulated radiation of a wavelength related to the size of the gain region 1140, the size and spacing of each of the photonic crystal dielectric pattern (e.g., periodic dielectric (e.g., liquid, solid or gas filled) spheres placed within the substrate). The voltages across the two electrodes 1120 are varied to drive the stimulated emission of radiation from the gain region 1140. However the spacing and size of the periodic structure is designed so that the stimulated radiation produced from the gain region 1140 is within the photonic crystal band gap. Thus the stimulated region can not escape the photonic crystal. If the cavity 1157 however is placed close the gain region 1140 then the stimulated radiation can escape through the cavity 1157. Appropriate gain material from the gain region 1140 are known but several examples are InGaAs, InGaP, InGaAsP, an excited dimer material, cerium-doped fluorides and lithium strontium such as lithium calcium aluminum fluoride, or $Ce^{3+}$:LiCalF$_6$ (Ce:LiCAF); a lithium strontium aluminum fluoride, or $Ce^{3+}$:LiSrAlF$_6$ (e.g., which produce tunable output directly in the 280- to 330-nm spectral region), Nd—YAG, ArF (193 nm), KrF (248 nm), XeCl (308 nm) and other gain material as known by one of ordinary skill in the relevant arts and equivalents.

In at least one exemplary embodiment the laser power of each photonic crystal laser can be approximately 500 micro Watt, so that the plate roughly has 3.1 kW/cm$^2$.

Thus at least one exemplary embodiment is directed to a laser photonic crystal comprising: a first photonic crystal layer; a second photonic crystal layer where the second photonic crystal layer includes at least a first cavity, and at least two electrodes a first electrode and a second electrode, where the first cavity is at least partially filled with a gain material, where a potential difference between the electrodes can excite the gain material into stimulated emission of radiation, where the radiation stimulated has a wavelength in the band gap of the second photonic crystal layer; and a third photonic crystal layer, where the third photonic crystal layer includes a first portion that can be adjusted to move a second cavity to a position so that a second portion of the stimulated radiation passes through the third photonic crystal layer. In at least one exemplary embodiment the stimulated radiation can be reflected between the electrodes through the first cavity.

At least one exemplary embodiment further includes a vertical comb drive that is operatively connected to a fourth photonic crystal section, where the fourth photonic crystal section includes the second cavity, where the vertical comb drive is moved to move the fourth photonic crystal in and out of the third photonic crystal layer so as to move the second cavity above the first cavity. While the second cavity is not positioned above the first cavity a continuation of the photonic crystal results in a band gap within which the stimulated radiation's wavelength lies. When the second cavity is positioned above the first cavity an allowed waveband, within which the wavelength of the stimulated radiation lies, is created within the band gap allowing the stimulated radiation to pass through the second cavity and through the third photonic crystal layer.

At least one further exemplary embodiment includes a cover layer, wherein the cover layer covers the third photonic crystal layer and is substantially transparent to the wavelength of the stimulated radiation.

III. Third Exemplary Embodiment

III.A. Charged Fluid Evaporation System

Instead of using an injected electron or photon from a surface to ionize an ambient medium, a charged droplet (e.g., one with net negative charge (i.e., electrons)) can be injected into a chamber, in which the droplet is evaporated (e.g., via heat, microwaves, or other appropriate method as known by one of ordinary skill in the relevant arts depending upon the material that the droplet is made of). When the droplet is evaporated the excess charge is now available in the ambient medium to be used in ionizing the ambient environment (e.g., via oscillation of the free electrons using ionizing frequency driven electromagnetic waves, or other electron oscillation and/or acceleration methods known by one of ordinary skill in the relevant arts to utilize the free electrons and/or ions and/or charged droplets to ionize at least a portion of the ambient environment. Charged droplets and aphrons and their formation is discussed in U.S. patent application Ser. No. 11/265, 041, filed Nov. 2, 2005, incorporated by reference in its entirety.

In summary of when a charged droplet, for example one with excess electrons is created, the droplet can break into smaller droplets (if the net charge is high enough e.g., the Coulomb force is greater than the surface tension). The charged drop also can start to evaporate until the size is such that net charge will break it into smaller droplets. Even if the droplet did not break into smaller droplets eventually the evaporation will turn the liquid base into a gas carrying net free charges. The net free charges can be acted upon by electric and/or magnetic fields to oscillate at a certain frequencies (e.g., see table 1) and used to ionize the ambient medium. Alternatively the free charges can be accelerated (e.g., using ExB drift) to the ionization energies of the ambient medium (e.g., see table 1 for energies) and impacted with a neutral ambient ionizing it in the process, triggering ambient medium plasma initiation. For example if using ExB drift via an E and B field generation system, the free charges + and − will be accelerated into the same direction. Once the energy equivalent to the ionization energy is reached then the collisions the free charges have with ambient neutrals can result in ionizations of the neutrals. The ions and electrons formed from the neutrals can result in ionizations feel the effect of an ExB drift, also colliding with neutrals and ionizing them. Thus the initial free charges can be used to initiate a larger plasma, which is ExB drifted (e.g., before they recombine back into neutrals, see patent application Ser. No. 10/441,638 for detailed discussion) to provide thrust.

FIG. 12 illustrates an example of an ExB engine using a charged medium injector to initiate a plasma in the engine, and accelerating the plasma via E and B field generators to produce engine thrust. Alternatively the plasma can be initiated via an injected charged fluid then accelerated via electric potentials.

The engine 1200 can include a ram cone 1210 (not drawn to scale); and an inlet 1220 where ambient or stored fluid flow 1205 (e.g., air, gas, water, and other fluids as known by one of ordinary skill in the relevant arts). The entered fluid flow then enters the plasma generation chamber 1230 where a portion 1217 is ionized. The ionization can be initiated by free electrons and/or ions in the plasma generation chamber inserted via charged fluid injection 1216 via a charged fluid injection system 1215. The free electrons and/or ions can be oscillated in the plasma generation chamber either via an injected electromagnetic wave at the correct frequency (e.g., see table 1, or plasma frequency) or by varying an electrostatic voltage differences across plates 1231 bordering either side of plasma generation chamber 1230. The oscillated free electrons and/or ions can ionize a portion 1217 of the fluid in the plasma generation chamber. The plasma can be accelerated via an ExB magnetic-electric field generator. The ExB drifted plasma enters the expansion and charge neutralization section 1240, where the portion of the drifted plasma which has not recombined to a neutral state upon entering the section 1240, is directed 1260 to the excess charge collection plates 1250 (e.g., via voltage difference between collection plates 1250). The drifted flow 1270 imparts an impulse to the vehicle propulsion system providing propulsion for any attached vehicle.

Thus, at least one exemplary embodiment is directed to a propulsion device comprising: at least a first charged fluid injector, where the first charged fluid injector is configured to inject a charged fluid into a plasma generation chamber including a medium, where the charged fluid provides free charges, where the free charges are energized, and where the energized free charges ionize at least a first portion of the medium; and a field generation device, where the field generation device is configured to generate an electric and magnetic field, and where the electric and magnetic fields have a ExB component, wherein the ExB component accelerates a second portion of the first portion producing a thrust.

At least one exemplary embodiment is directed to a propulsion device also including a heating unit, wherein the heating unit changes the phase of the charged fluid into a gas including the free charges. For example if the charged fluid is water the heating unit can be a microwave source to evaporate the charged fluid and/or droplets along their path so that a substantial portion is converted into a gaseous phase including free charges.

In at least one exemplary embodiment the propulsion device further includes a free charge energizing device including an oscillating electromagnetic field generator, where the oscillation frequency is selected to ionize the first portion. For example if the kinetic energy of the free charges is such that it is equal to or greater than the average ionization energy of the medium in eth plasma generation chamber then oscillating free charges will ionize a portion of the medium. The frequency needed to oscillate the free charges can be determined by calculating the average velocity of the free charges during oscillation and using the average mass of one free charge and calculating an average energy. The average energy of a free charge is set to be equal to or greater than the average ionization energy. Thus the velocity needed can be calculated and the oscillation frequency calculated. The oscillation field can be generated by oscillating voltage plates on either side of the plasma generation chamber or region. For example the oscillation frequency can be set to the plasma frequency associated with the free charges in the mediums, thus heating the free charges.

Alternatively in at least one exemplary embodiment the free charges can be accelerated via a potential difference along an axial direction of the plasma generation chamber energizing the translation energy of the free charges to an energy at least the minimum ionization energy of the medium. For example rings around the plasma generation chamber spaced along the axial directed can have various voltages resulting in a potential difference accelerating the free charges.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A propulsion device comprising:
   at least a first charged fluid injector, wherein the first charged fluid injector is configured to inject a charged fluid into a plasma generation chamber including a medium, wherein the charged fluid provides free charges, wherein the free charges are energized, and wherein the energized free charges ionize at least a first portion of the medium; and
   a field generation device, wherein the field generation device is configured to generate an electric and magnetic field, and wherein the electric and magnetic fields have a ExB component, wherein the ExB component accelerates a portion of the first portion producing a thrust.

2. The propulsion device according to claim 1, further comprising:
   a heating unit, wherein the heating unit changes the phase of a portion of the charged fluid into a gas including the free charges.

3. The propulsion device according to claim 2, wherein the heating unit is a microwave generator.

4. The propulsion device according to claim 3 further comprising:
   a free charge energizing device including an oscillating electromagnetic field generator, wherein the oscillation frequency is selected to ionize the first portion.

5. The propulsion device according to claim 4, wherein the frequency is the plasma frequency associated with the free charges in the medium.

6. The propulsion device according to claim 3, further comprising:
   a free charge acceleration device, wherein the acceleration device is configured to generate a potential difference that accelerates the free charges to an energy equal to or greater than the average ionization energy of the medium.

7. The propulsion device according to claim 1, where the medium is injected into the plasma generation chamber.

8. The propulsion device according to claim 7, where the medium is ambient air that enters the plasma generation chamber from an inlet, where a portion of the charged fluid is turned into gas with a net charge, where the gas with a net charge mixes with a portion of the air in plasma generation chamber, where the gas with a net charge is oscillated at a frequency that ionizes a portion of the air, where the ionized portion of the air is accelerated to the ExB drift velocity producing thrust.

9. The propulsion device according to claim 8, where the portion of the charged fluid that is turned into gas with a net charge is turned into the gas by a heating unit.

10. The propulsion device according to claim 8, where the ambient air is composed of the gases in the ambient environment through which the propulsion device travels.

11. The propulsion device according to claim 8, further including a charge generation device, where the generating device neutralizes the exhaust of the propulsion device.

* * * * *